United States Patent [19]

Tanabe

[11] Patent Number: 5,457,421
[45] Date of Patent: Oct. 10, 1995

[54] VOLTAGE STEPDOWN CIRCUIT INCLUDING A VOLTAGE DIVIDER

[75] Inventor: Akira Tanabe, Tokyo, Japan

[73] Assignee: NEC Corporation, Tokyo, Japan

[21] Appl. No.: 194,330

[22] Filed: Feb. 8, 1994

[30] Foreign Application Priority Data

Feb. 10, 1993 [JP] Japan .................. 5-022232

[51] Int. Cl.[6] .................................. H03K 3/01
[52] U.S. Cl. ............... 327/530; 327/306; 327/333; 327/544; 327/546
[58] Field of Search ............... 307/296.1, 296.2, 307/296.3, 296.4, 296.5, 296.6, 353, 532, 350; 328/127; 327/530, 535, 541, 544, 546, 306, 333

[56] References Cited

U.S. PATENT DOCUMENTS

| | | | |
|---|---|---|---|
| 4,061,929 | 12/1977 | Asano | 307/296.1 |
| 4,754,226 | 6/1988 | Lusignan et al. | 328/127 |
| 4,868,908 | 9/1989 | Pless et al. | 323/267 |
| 5,168,174 | 12/1992 | Naso et al. | 307/296.6 |
| 5,281,860 | 1/1994 | Krenik et al. | 328/127 |
| 5,304,859 | 4/1994 | Arimoto | 307/296.2 |
| 5,309,399 | 5/1994 | Murotani | 307/296.1 |
| 5,341,050 | 8/1994 | Mellissinos et al. | 328/127 |
| 5,347,170 | 9/1994 | Hayakawa et al. | 307/296.1 |

FOREIGN PATENT DOCUMENTS

0492538A2  12/1991  European Pat. Off. .
2553545    4/1985   France .................. 328/127
63-121467  5/1988   Japan .

OTHER PUBLICATIONS

T. Takeshima et al.; "A 55–ns 16–Mb DRAM with Built–in Self–Test Function Using Microprogram ROM"; IEEE Journal of Solid–State Circuits, vol. 25, No. 4, Aug. 1990, pp. 903–911.

Primary Examiner—Timothy P. Callahan
Assistant Examiner—Kenneth B. Wells
Attorney, Agent, or Firm—Whitham, Curtis, Whitham & McGinn

[57] ABSTRACT

A voltage step-down circuit to be built in a highly integrated semiconductor IC chip, including a voltage divider and a voltage comparator. A divided output voltage $V_{INT}$ of the voltage divider and a comparison reference voltage $V_{REF}$ are applied to respective input terminals (−) and (+) of the voltage comparator. An output signal of the voltage comparator is supplied to a control signal generator section of the voltage divider to generate control pulses and to control the connection of capacitors of a voltage divider section of the voltage divider with the control pulses so as to supply the divided output voltage $V_{INT}$ to a load circuit. In this case, the capacitors are used as a voltage divider for generating a voltage for an internal circuit from an external power source voltage. Thus, power loss can be reduced and utilization efficiency of the capacitors is raised. Hence, the voltage step-down circuit is suitable for highly integrated semiconductor IC chip.

15 Claims, 15 Drawing Sheets

Φ1 : First Control Signal     Φ2 : Second Control Signal

Φ1: HIGH LEVEL   Φ2: LOW LEVEL                Φ1: LOW LEVEL   Φ2: HIGH LEVEL

CHARGE                                        DISCHARGE

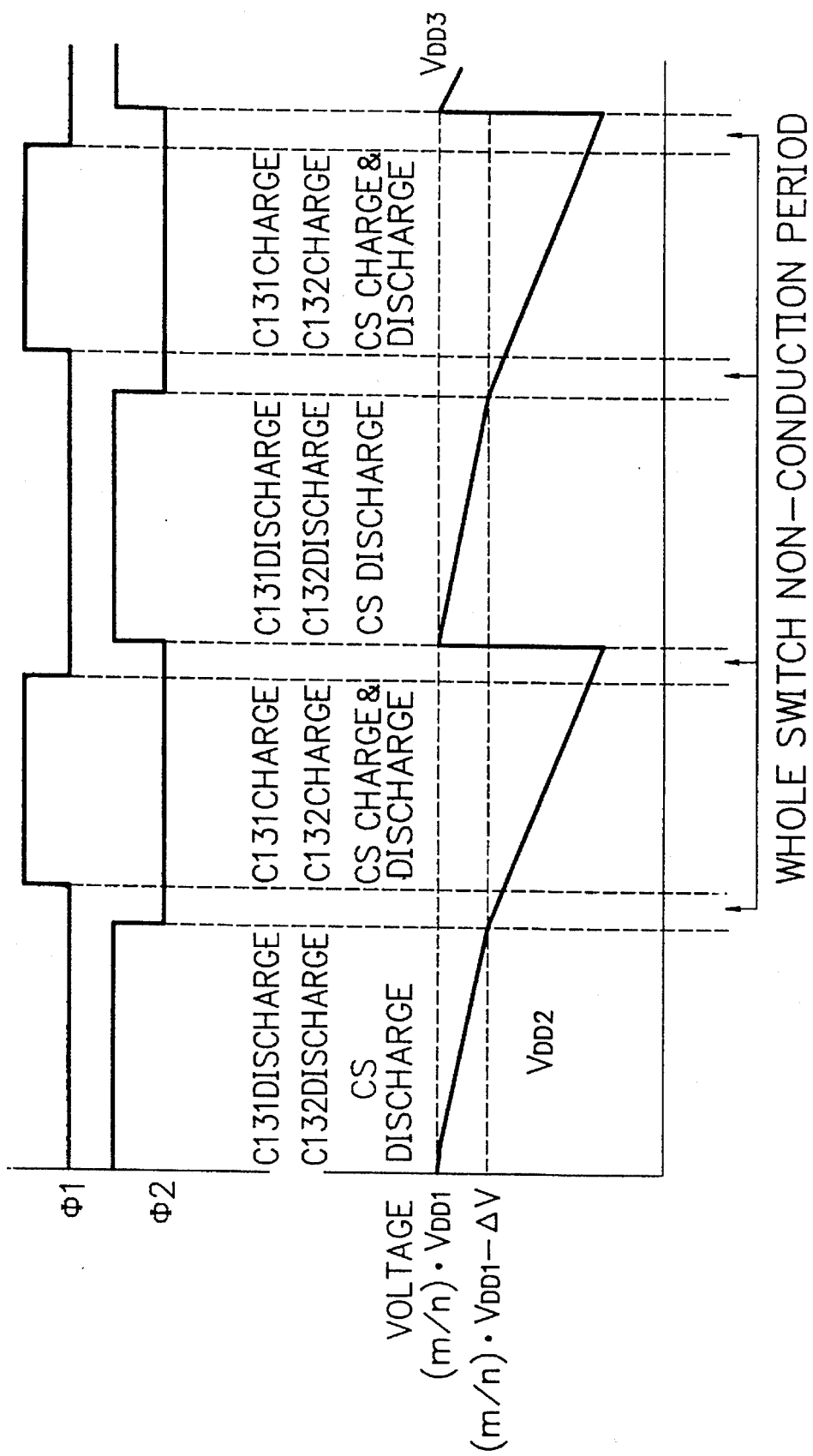

F I G. 10
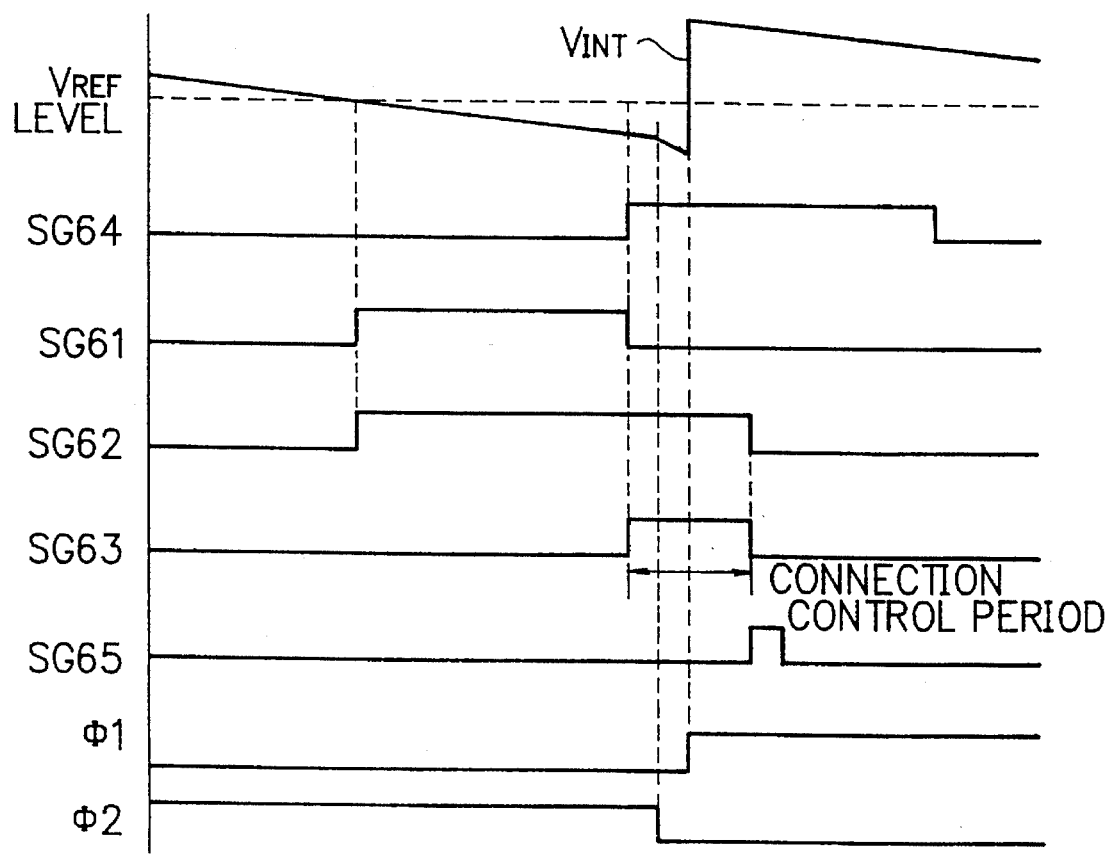

VOLTAGE STEPDOWN CIRCUIT INCLUDING A VOLTAGE DIVIDER

BACKGROUND OF THE INVENTION

The present invention relates to a voltage drop circuit including a voltage divider circuit which uses capacitors, and more particularly to a voltage drop circuit of a low consumption power type of this kind suitable to be built in a large capacity semiconductor dynamic random access memory (DRAM) chip.

DESCRIPTION OF THE RELATED ART

A semiconductor IC chip such as a large capacity DRAM has a built-in voltage drop circuit for reducing power source voltage so as to operate internal circuits such as a memory cell array at a low voltage. A typical example of a voltage drop circuit of this kind in the prior art has a structure of a so-called series regulator configuration, as disclosed in a paper of the IEEE Journal of Solid-state Circuits, Vol. 25, No. 4, pp. 908–911, 1990.

The conventional voltage drop circuit 120 is provided with a voltage comparator 121 and a p-type FET (field effect transistor) 122 to input an output of the voltage comparator 121 at its gate electrode, as shown in FIG. 1. A comparison reference voltage $V_{REF}$ is applied to one input terminal (−) of the voltage comparator 121 and a power source voltage $V_{DD}$ is supplied to the source electrode of the FET 122 via a power source terminal 124. And a voltage $V_{INT}$ output from the drain electrode of the FET 122 is fed to another input terminal (+) of the voltage comparator 121 and an output terminal 125.

Between the output terminal 125 and an earth voltage point, a load circuit Z such as a memory circuit of the aforementioned semiconductor IC chip with a built-in voltage drop circuit 120 is connected. By applying the comparison reference voltage $V_{REF}$ and the output voltage $V_{INT}$ to the respective input terminals (−) and (+) of the voltage comparator 121, the circuit is controlled so that a current flowing in the FET 122 may increase when the output voltage $V_{INT}$ drops rather than the comparison reference voltage $V_{REF}$, so as to obtain a low voltage supply circuit to the load circuit Z.

Another example of a conventional voltage drop circuit is disclosed in Japanese Patent Laid-Open No. Sho 63-121467, as shown in FIG. 2. In this case, as shown in FIG. 2, the voltage drop circuit 130 has the above-described series regulator configuration. That is, in addition to a combination of a comparator circuit 131 and an output FET 132 for inputting its output at the gate electrode, there is provided a capacitor voltage divider circuit 134 inserted between a power source terminal 135 of a power source voltage $V_{DD1}$ and the source electrode of the output FET 132 and one input terminal (−) of the comparator circuit 131 is connected to the earth voltage point. The voltage divider circuit 134 is comprised of one series connection circuit which includes a first capacitor C131 coupled with the power source terminal 135 via a first switch S131, a second switch S132 and a second capacitor C132 connected to an earth terminal 136 of an earth voltage GND, another series connection circuit which includes a third switch S133 coupled with a connection point between the first switch S131 and the first capacitor C131 and a third capacitor $C_S$ connected to the earth terminal 136, a fourth switch S134 for selectively connecting the connection point between the first capacitor C131 and the second switch S132 with the earth terminal 136, and a fifth switch S135 for selectively coupling the connection point between the second switch S132 and the second capacitor C132 with the connection point between the third switch S133 and the third capacitor $C_S$. A partial output voltage $V_{DD3}$ obtained at the connection point between the third switch S133 and the third capacitor $C_S$ is applied to the source electrode of the output FET 132. An ouput voltage $V_{DD2}$ obtained from the drain electrode of the output FET 132 is applied to the another input terminal (+) of the comparator circuit 131 and a low voltage operational load circuit Z via an output terminal 133.

In this case, the first and second switches S131 and S132 and the third, fourth and fifth switches S133, S134 and S135 are opened or closed in response to first and second control signals Φ1 and Φ2, respectively.

Next, the operation of the conventional voltage drop circuit 130 will now be described with reference to FIGS. 3a and 3b which show an equivalent circuit of the voltage divider circuit 134 and its operational waveform view, respectively.

When the first control signal Φ1 is a high level for the first and second switches S131 and S132 to be on and the second control signal Φ2 is a low level for the third, fourth and fifth switches S133, S134 and S135 to be off (the state shown in FIG. 2), the first and second capacitors C131 and C132 are connected in series between the power source voltage $V_{DD1}$ and the earth voltage GND and become a charged state (a charge in FIG. 3a). At this time, to the output FET 132, the partial output voltage $V_{DD3}$ corresponding to a holding capacity of the third capacitor $C_S$ is supplied and the output voltage $V_{DD2}$ of the output FET 132 is fed to the load circuit Z via the output terminal 133.

Next, when the first control signal Φ1 is the low level with the first and second switches S131 and S132 to be off and the second control signal Φ2 is the high level with the third, fourth and fifth switches S133, S134 and S135 to be on, the first and second capacitors C131 and C132 are cut from the power source voltage $V_{DD1}$, and the first, second and third capacitors C131, C132 and $C_S$ are connected in parallel with each other (a discharge in FIG. 3a), and the total capacity of the first, second and third capacitors C131, C132 and $C_S$, which is the maximum voltage $V_{DD3}$ max is inserted between the source electrode of the output FET 132 and the earth voltage point 136.

In the high level period of the second control signal Φ2, the output voltage $V_{DD2}$ of the FET 132 drops from the whole capacity $V_{DD3}$ max, that is, $(½) \cdot V_{DD1}$ to the level of $(½) \cdot V_{DD1} - \Delta V$ with the passage of discharge time, and in the high level period of the first control signal Φ1, including the whole switch non-continuity period, since the output voltage $V_{DD2}$ becomes only the holding capacity of the third capacitor $C_S$, its level further drops from the $(½) \cdot V_{DD1} - \Delta V$ (FIG. 3b).

In the first conventional voltage drop circuit shown in FIG. 1, a power loss P ($V_{DS} \times I_{DS}$) due to a voltage $V_{DS}$ and a current $I_{DS}$ between the source and drain electrodes of the FET 122 is caused to bring about a rise in temperature of the IC chip constituting the load circuit Z.

Similarly, in the second conventional voltage drop circuit shown in FIG. 2, a power loss between the source and drain electrodes of the FET 182 arises in the same manner as the first conventional voltage drop circuit to inevitably cause the temperature rise of the IC chip and also it is impossible to carry out a simultaneous charging of the first to third capacitors C131, C132 and $C_S$. Hence, the utilization efficiency of the capacitors, that is, the utilization efficiency of the IC chip surface area is low and it is hard to improve the integration degree.

SUMMARY OF THE INVENTION

It is therefore an object of the present invention to provide a voltage drop circuit with a capacitor voltage divider circuit base in view of the aforementioned problems of the prior art, which is capable of preventing a consumption power loss and heat generation and stabilizing divided output voltages and which is suitable for high integration degree of a semiconductor IC chip.

In accordance with one aspect of the present invention, there is provided a voltage drop circuit to be built in a semiconductor integrated circuit chip including a first terminal for inputting an external power source voltage, a second terminal to be maintained to a reference voltage, and an internal circuit having a predetermined function, connected to the first and second terminals, the voltage drop circuit dropping the external power source voltage and applying a dropped voltage to the internal circuit, comprising: (A) a voltage divider circuit including: (a) first and second capacitors having an equal capacity; (b) two pairs of first switch elements which are inserted between one electrodes of the first and second capacitors and the first terminal and between another electrodes of the first and second capacitors and the second terminal and which are selectively conducted in response to a control signal; (c) a pair of second switch elements which are inserted between one electrode of the first capacitor and another electrode of the second capacitor and between another electrode of the first capacitor and one electrode of the second capacitor and which are selectively conducted in response to the control signal; (d) a pair of third switch elements which are inserted in series between one electrode of the first capacitor and one electrode of the second capacitor and are selectively conducted in response to the control signal; (e) an output terminal connected to a connection point between the pair of third switch elements and to the internal circuit; and (f) control signal generating means for generating the control signals for controlling conduction states of the first, second and third switch elements so that the first and second capacitors are alternately charged by the external power source voltage supplied from the first terminal and are alternately discharged to the internal circuit from the output terminal in a complementary manner to the charging; and (B) connection control signal generating means for generating a connection control signal for controlling the generation of the control signals in the control signal generating means in response to a comparison result between a discharge output to the internal circuit and a predetermined comparison reference voltage.

In the voltage drop circuit, the connection control signal generating means includes voltage comparator means having first and second input terminals; voltage dividing means connected to the first terminal for dividing the external power source voltage to generate the comparison reference voltage: and wiring means for connecting the first input terminal of the voltage comparator means to the output terminal and the second input terminal of the voltage comparator means to the voltage dividing means.

The control signals are constructed so as not to overlap in front and rear edge portions of the alternate charge and discharge periods of the first and second capacitors.

The internal circuit is a large capacity dynamic random access memory including a memory cell array for inputting a precharge voltage in response to a precharge control pulse synchronizing with a front edge of a read cycle and the output terminal is connected to a sense amplifier of the dynamic random access memory. A fourth switch element is inserted between the first terminal and the output terminal and is selectively conducted in response to the precharge control pulse.

The internal circuit is a circuit of a large capacity dynamic random access memory which has a heavy-load operational period operable by a relatively heavy-current and a light-load operational period operable by a relatively light-current and which is tends to vary an output voltage on the output terminal. A supplementary voltage comparator means compares the output voltage with a supplementary comparison reference voltage lower than the comparison reference voltage, and a switch element is inserted between the first terminal and the output terminal and is selectively conducted in response to an output of the supplementary voltage comparator means.

In the voltage drop circuit, a frequency counter is connected to the output of the supplementary voltage comparator means so as to detect the heavy-load operational period and the light-load operational period and detects repeat frequency of a pulse output appearing on the output of the supplementary voltage comparator means, and controller controls the supplementary voltage comparator means to selectively become an operational state in response to the output of the frequency counter and to cause the output to be supplied to the switch element.

The control signal generating means includes a first bistable circuit for inputting the output of the voltage comparator means at one of a pair of input terminals, a second bistable circuit which inputs a pair of outputs of the first bistable circuit at a pair of input terminals and supplies its output as the connection control signal to the voltage dividing means and a logic circuit which gives a delay to the connection control signal and executes a pulse width conversion to supply a pulse width converted signal to another of the pair of input terminals of the first bistable circuit.

In the voltage drop circuit, at least one delay circuit is connected to an output of the voltage comparator means and outputs a delay connection control signal for giving a predetermined delay to the connection control signal and at least one subordinate voltage divider circuit has substantially the same construction as the voltage divider circuit, including first and second terminals connected to the corresponding first and second output terminals of the voltage divider circuit, and which inputs the delay connection control signal by control signal generating means corresponding to the control signal generating means of the voltage divider circuit.

In the voltage drop circuit, three delay circuits and three subordinate voltage divider circuits can be provided.

In the voltage drop circuit of the present invention, the voltage of the external power source voltage supplied to the semiconductor IC chip is divided by the voltage divider circuit of the capacitors to obtain a divided output voltage to be supplied to the internal circuit, and there is no power loss. Hence, there is no temperature increase of the IC chip. Further, the charge and discharge of a plurality of capacitors constituting the voltage divider circuit can be executed at the same time and thus the utilization efficiency of the capacitors is raised. As a result, the occupying area of the capacitors on the IC chip is reduced and this contributes to improvement of the integration degree of the whole IC chip.

BRIEF DESCRIPTION OF THE DRAWINGS

The objects, features and advantages of the present invention will become more apparent from the consideration of the following detailed description, taken in conjunction with the accompanying drawings, in which:

FIG. 3b is a time chart for explaining an operation of the conventional circuit shown in FIG. 2;

FIG. 4a is a block diagram of a first embodiment of a voltage drop circuit according to the present invention and FIG. 4b is a block diagram of a control signal generator used in the circuit shown in FIG. 4a;

FIG. 5a is a circuit diagram showing an equivalent circuit of a voltage divider constituting a part of the circuit shown in FIG. 4a and FIG. 5b is a time chart for explaining an operation of the circuit shown in FIG. 4a;

FIG. 6a is a block diagram of a second embodiment of a voltage drop circuit according to the present invention and FIG. 6b is a time chart for explaining an operation of the circuit shown in FIG. 6a;

FIG. 7a is a block diagram of a third embodiment of a voltage drop circuit according to the present invention and FIG. 7b is a time chart for explaining a operation of the circuit shown in FIG. 7a;

FIG. 8a is a block diagram of a fourth embodiment of a voltage drop circuit according to the present invention and FIG. 8b is a time chart for explaining an operation of the circuit shown in FIG. 8a;

FIG. 10 is a time chart for explaining an operation of the circuit shown in FIG. 9;

FIG. 13a is a block diagram of a seventh embodiment of a voltage drop circuit according to the present invention and FIG. 13b is a time chart for explaining an operation of the circuit shown in FIG. 13a.

DESCRIPTION OF THE PREFERRED EMBODIMENTS

Figure 1:
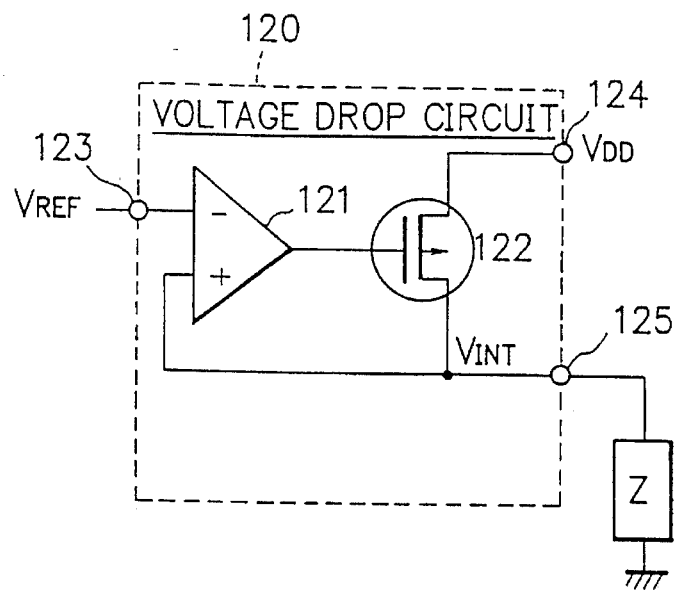
FIG. 1 is a block diagram of one conventional voltage drop circuit.

The present invention will now be described in connection with its preferred embodiments with reference to the accompanying drawings, wherein like reference characters designate like or corresponding parts throughout the views and thus the repeated description thereof can be omitted for brevity.

Figure 4A:
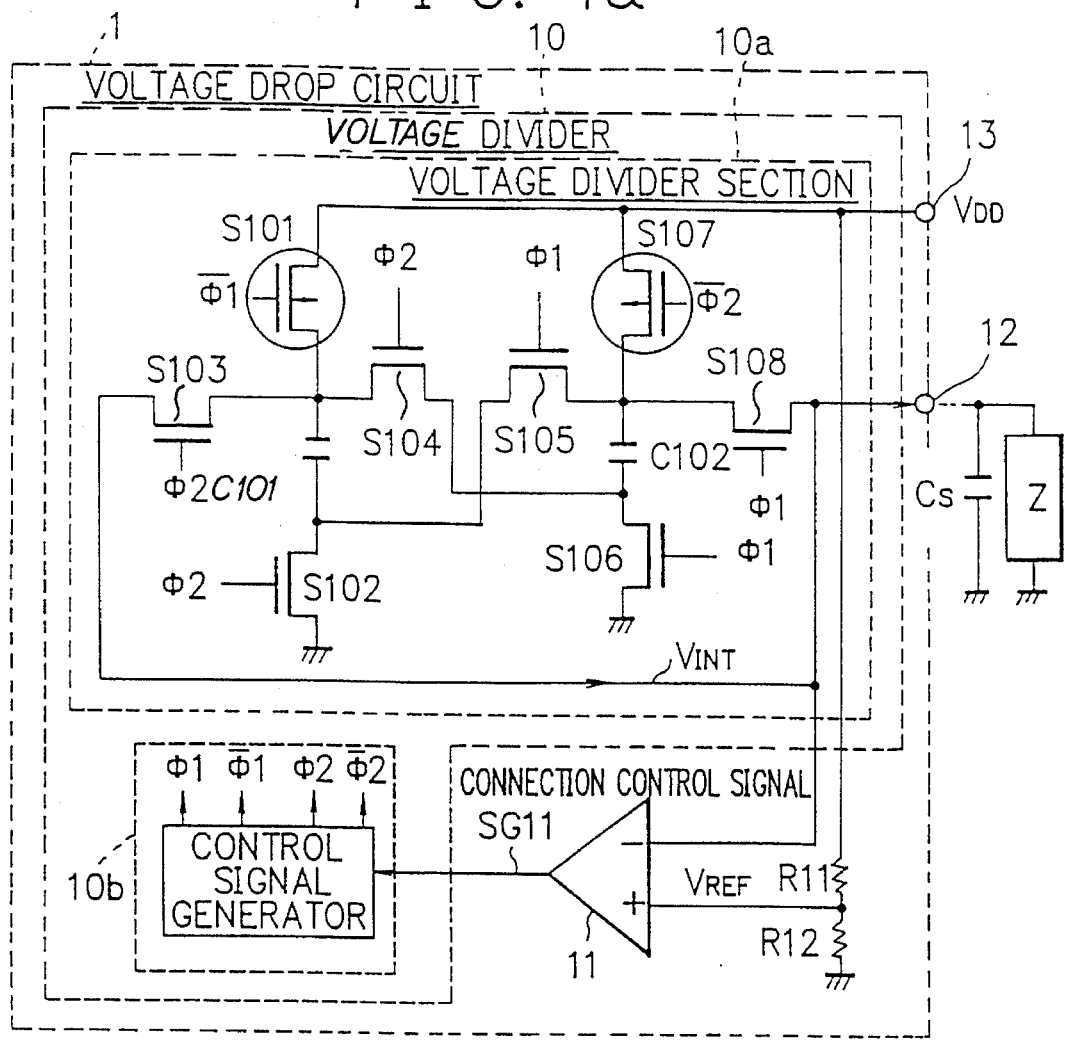
Figure 4B:
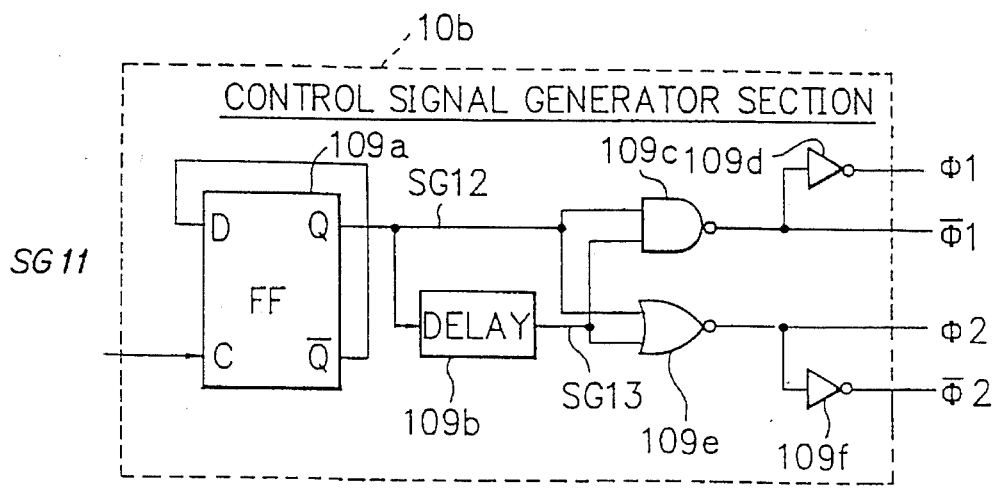
Figure 5A:
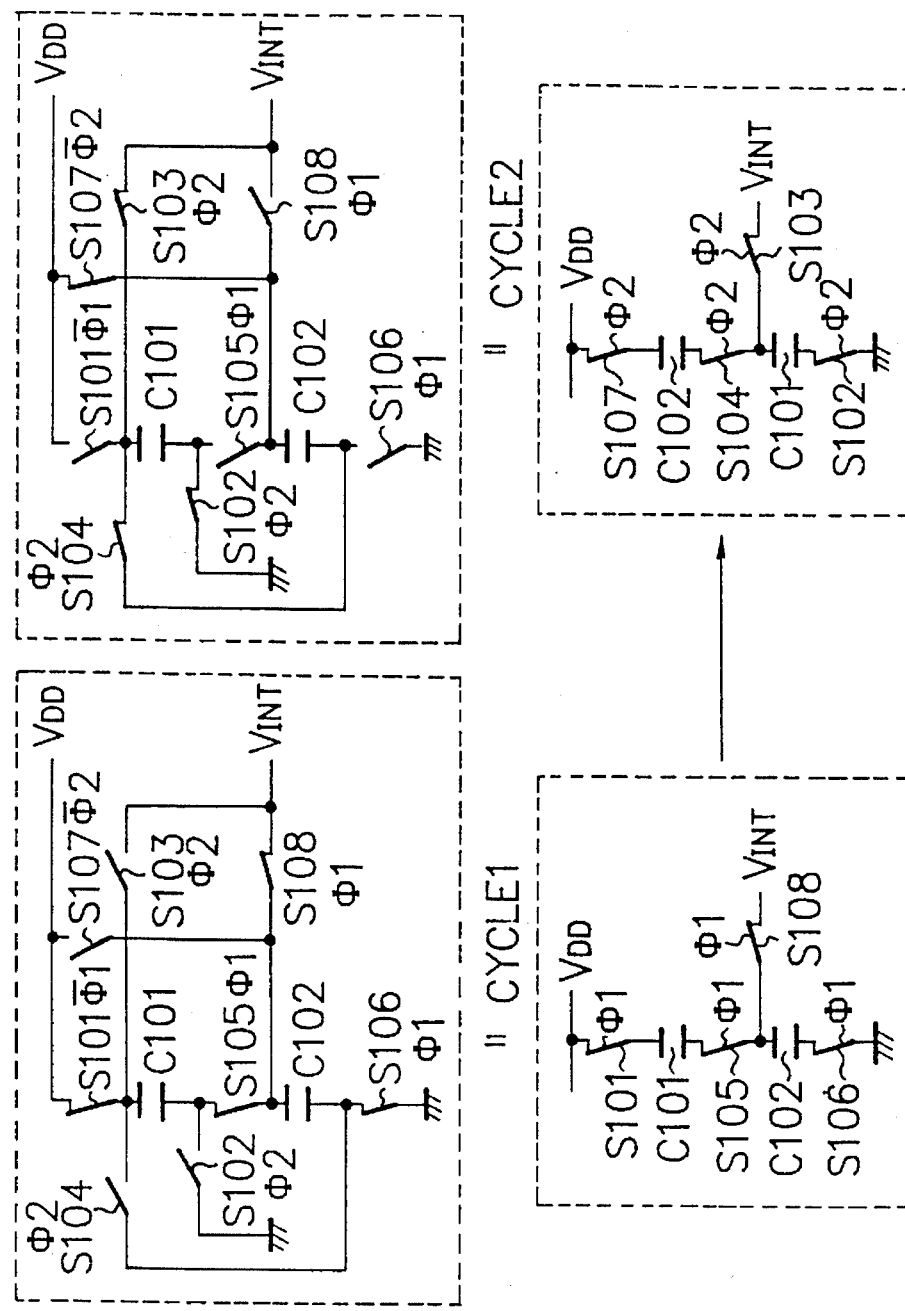

The first embodiment of a voltage drop circuit according to the present invention will now be described in connection with FIGS. 4a and 4b and FIGS. 5a and 5b. FIG. 4a shows the first embodiment of the voltage drop circuit and FIG. 4b shows a control signal generator used in this embodiment. Also, FIG. 5a shows an equivalent circuit of a voltage divider constituting a part of this embodiment and FIG. 5b shows a time chart including waveforms for explaining the operation of this embodiment.

As shown in FIG. 4a, the voltage drop circuit 1 is comprised of a voltage divider 10 and a voltage comparator 11. A divided output voltage $V_{INT}$ of the voltage divider 10 is applied to one input terminal (−) of the voltage comparator 11 and a voltage at a connection point between two series resistors R11 and R12 which are inserted between a power source terminal 13 of an external power source voltage $V_{DD}$ and an earth electrode of an earth voltage GND is applied as a comparison reference voltage $V_{REF}$ to another input terminal (+) of the voltage comparator 11. An output SG11 of the voltage comparator 11 as a connection control signal is supplied to the voltage divider 10. At an output terminal 12 inputting the divided output voltage $V_{INT}$, the whole internal circuits of a semiconductor IC chip with a built-in voltage drop circuit 1 are connected as a load circuit Z and a stabilizing capacitor $C_S$ by a wiring capacity is connected in parallel with the load circuit Z.

The voltage divider 10 includes a voltage divider section 10a and a control signal generator section 10b for generating first, second, third and fourth control pulses $\Phi1B$ or $\Phi1$ (an inverted signal of $\Phi$ is hereinafter referred to as $\Phi B$ or $\bar{\Phi}$), $\Phi1$, $\Phi2B$ or $\Phi2$ and $\Phi2$ for switching connections of first and second capacitors C101 and C102 in response to the connection control signal SG11. The voltage divider section 10a is comprised of a first series connection circuit which is inserted between the power source voltage $V_{DD}$ and the earth voltage GND and includes a first FET switch S101, a first capacitor C101, a fifth FET switch S105, a second capacitor C102, and a sixth FET switch S106 connected in series: a second series connection circuit which is inserted between the power source voltage $V_{DD}$ and the earth voltage GND and includes a seventh FET switch S107, the second capacitor C102, a fourth FET switch S104, the first capacitor C101 and a second FET switch S102 connected in series; a third FET switch S103 for selectively connecting the connection point among the first FET switch S101, the first capacitor C101 and the fourth FET switch S104 to the output terminal 12 of the voltage divider 10; and an eight FET switch S108 for selectively connecting the connection point among the seventh FET switch S107, the second capacitor C102 and the fifth FET switch S105 to the output terminal 12. Further, the first FET switch S101 is opened or closed in response to the first control pulse $\Phi1B$, the fifth, sixth and eighth FET switches S105, S106 and S108 are opened or closed in response to the second control pulse $\Phi1$, the seventh FET switch S107 is opened or closed in response to the third control pulse $\Phi2$, and the second, third and fourth FET switches S102, S103 and S104 are opened or closed in response to the fourth control pulse $\Phi2$. In this case, it is assumed that the first and seventh FET switches S101 and S107 are turned on when the control pulses are the low level and the second, third, fourth, fifth, sixth and eighth FET switches S102, S103, S104, S105, S106 and S108 are turned on when the control pulses are the high level.

Figure 5B:
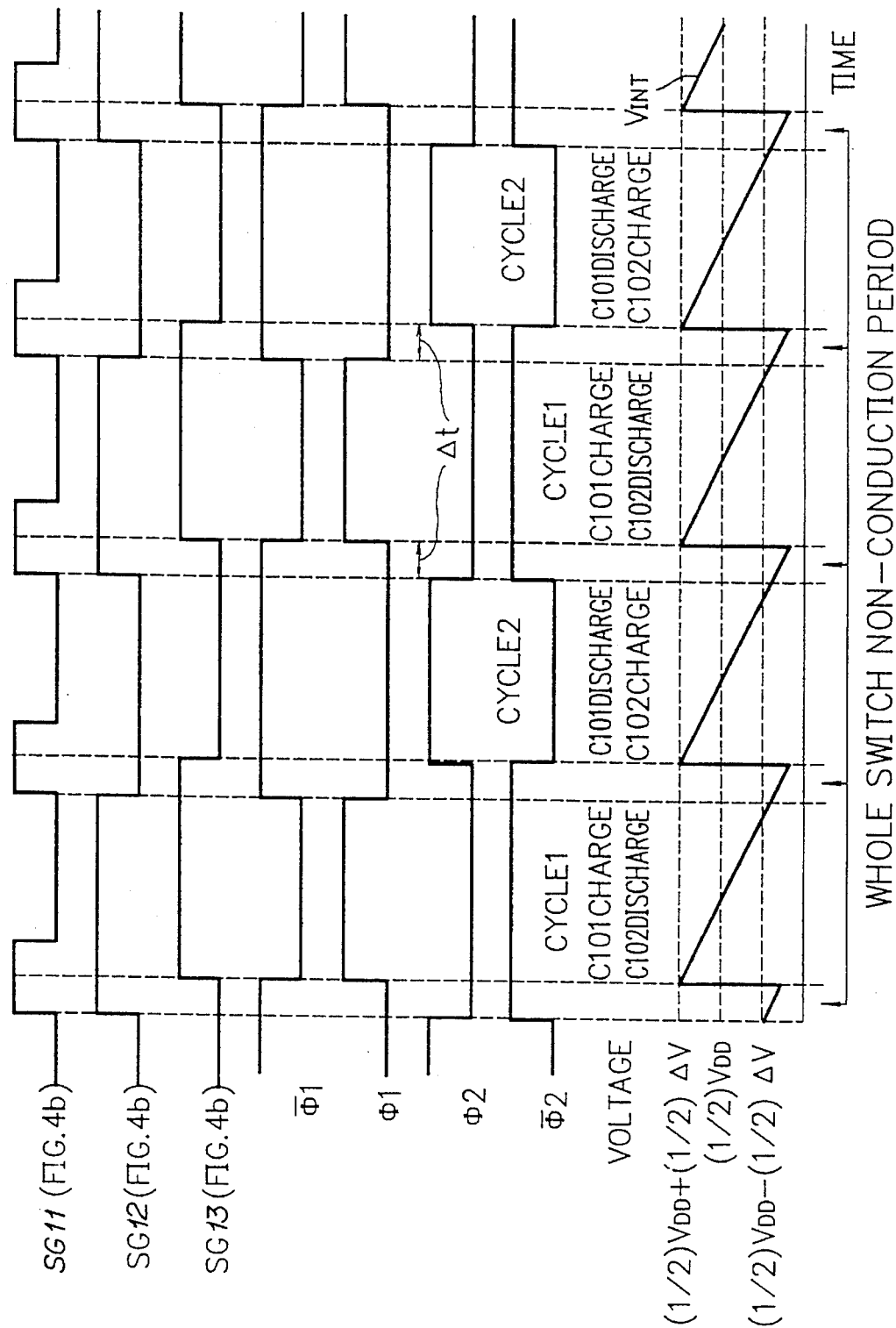

In FIG. 4b and FIG. 5b, the control signal generator section 10b generates the above-described control signals varying in synchronism with the leading edges of the connection control signal. That is, the control signal generator section 10b includes a flip-flop circuit 109a which inputs the connection control signal at its input terminal C and outputs a signal SG12, a delay circuit 109b which inputs the output signal SG12 and outputs a delayed signal SG13, a pair of NAND circuit 109c and NOR circuit 109e which input the output signal SG12 output from the flip-flop circuit 109a and the delayed output signal SG13 of the delay circuit 109b at their input terminals to output the first and fourth control signals Φ1B and Φ2, respectively, and a pair of inverter circuits 109d and 109f, connected to the output terminals of the respective NAND circuit 109c and NOR circuit 109e, to output the second and third control signals Φ1 and Φ2B, respectively.

In this embodiment, as shown in FIGS. 4a and 4b and FIGS. 5a and 5b, first, when the second control pulse Φ1 is the high level, the switches S101, S105, S106 and S108 are closed or conducting and the other switches are opened or non-conducting. In this state, the first capacitor C101 is charged on a route of the power source voltage $V_{DD} \to$ the first FET switch S101 →. The first capacitor C101, the second capacitor C102 is connected in parallel with the stabilizing capacitor $C_S$ via the eighth FET switch S108, and its electric charge is discharged through the load circuit Z (cycle 1).

Next, when the fourth control pulse Φ2 becomes the high level, the switches S107, S104, S102 and S103 are closed and the other switches are opened. In this state, the second capacitor C102 is charged on a route of the power source voltage $V_{DD} \to$ the seventh FET switch S107 → the second capacitor C102 and the the electric charge of the first capacitor C101 is discharged through the closed third FET switch S103 and the load circuit Z (cycle 2).

By repeating the above-described operation in response to the connection control signal SG11 becoming the active level, the divided output voltage $V_{INT}$ can be held in a range from $(½) \cdot V_{DD} + (½) \cdot \Delta V$ to $(½) \cdot V_{DD} - (½) \cdot \Delta V$ with $(½) \cdot V_{DD}$ level as the center, provided that a period when all the switches are off is determined for preventing a power loss due to a mutual short-circuit among the capacitors C101, C102 and $C_S$. The stabilizing capacitor $C_S$ is the wiring capacity from the voltage drop circuit 1 to the load circuit Z and has a function for holding the divided output voltage $V_{INT}$ to a stable value even in the period when all the switches are off. However, the level of the divided output voltage $V_{INT}$ in this period drops below $(½) \cdot V_{DD} - (½) \cdot \Delta V$ and its level is decided depending on the stabilizing capacitor $C_S$.

In the above-described circuit, the first and second capacitors C101 and C102 have an equal capacity value and respective interterminal voltages V101 and V102. As shown by thick lines in cycle 1 in FIG. 5a, the switch S101 is on in response to the low level of the first control pulse Φ1B and the switches S105, S106 and S108 are on in response to the high level of the second control pulse Φ1, as described above. And the other switches S102, S104 and S107 are off and the capacitors C101 and C102 are connected between the switches S101 and S105 and switches S105 and S106, respectively. That is, the first capacitor C101 on the power source voltage $V_{DD}$ side and the second capacitor C102 on the earth voltage point side are connected in series and are charged so that the terminal voltages of the capacitors C101 and C102 may be mutually equal, the divided output voltage $V_{INT}$ can be expressed as follows.

$$V_{INT} = (½) \cdot V_{DD} \tag{1}$$

By applying the divided output voltage $V_{INT}$ to the load circuit Z, the charging is continued to the capacitor C101 from the output terminal 12 to the power source terminal 13 as it is, but the capacitor C102 from the output terminal 2 to the earth voltage GND is discharged via the load circuit Z until it becomes the desired voltage. The operation up to this is cycle 1, as described above (FIG. 5b).

Next, as shown by the thick lines in cycle 2 in FIG. 5a, when the third control pulse Φ2B becomes the low level, the switch S107 is on in response to low level of the control pulse Φ2B and the switches S104, S102 and S103 are on in response to the high level of the fourth control pulse Φ2. And the other switches S101, S105, S106 and S108 are off and the capacitors C101 and C102 are connected between the switches S104 and S102 and switches S107 and S104, respectively. That is, the capacitor C102 on the power source voltage $V_{DD}$ side and the capacitor C101 on the earth voltage point side are connected in series and the capacitors C101 and C102 in cycle 1 are replaced each other. Since this connection state is caused after the charge and the discharge are executed in cycle 1, the capacitor C101 is in the charged state and the capacitor C102 is in the discharged state. Hence, the relationship between the voltage V101 of the capacitor C101 and the voltage V102 of the capacitor C102 is V101>V102 and thus the potential of the divided output voltage $V_{INT}$ is increased again by the capacitor C102 in the charged state. This operation cycle 2 starts from this initial condition (FIG. 5b).

In the above-described cycle 1, the control signal generator section 10b controls the second and third control pulses Φ1 and Φ2B to the high level and the first and fourth control pulses Φ1B and Φ2 to the low level and supplies these control pulses to the voltage divider section 10a, and, when the capacitor C102 is discharged to drop the level of the divided output voltage $V_{INT}$ below the comparison reference voltage $V_{REF}$ divided by the resistors R11 and R12, the connection control signal SG11 is output from the voltage comparator 11. In response to this pulse signal, the control signal generator section 10b changes the second and third control pulses Φ1 and Φ2B to the low level and the first and fourth control pulses and Φ2 to the high level to switch the voltage divider section 10a to cycle 2. In cycle 2, when the capacitor C101 is discharged to drop the level of the divided output voltage $V_{INT}$ below the comparison reference voltage $V_{REF}$, the connection control signal SG11 is output again from the voltage comparator 11. In response to this pulse signal, the control signal generator section 10b changes the second and third control pulses and Φ2B to the high level and the first and fourth control pulses Φ1B and Φ2 to the low level to switch the voltage divider section 10a to the above-described cycle 1. As described above, cycle 1 and cycle 2 are alternately repeated every output of the connection control signal SG11.

By the above-described operation, the voltage of the divided output voltage $V_{INT}$ can be always held in the vicinity of $(½) \cdot V_{DD}$ represented in formula (1).

When the charge and the discharge are repeated as described above in the steady state, the range ($\Delta V$) of variations in level of the voltage is decided depending on the comparison reference voltage $V_{REF}$ determined in consideration of a permissible voltage variation of the load circuit Z. Assuming that the connection switching of the capacitors C101 and C102 is effected under the condition when the divided output voltage $V_{INT}$ becomes $(½) \cdot V_{DD} - \Delta V/2$, the relationship between the voltages of both the ends of the capacitors C101 and C102 in cycle 1 in FIG. 5b right before the connection switching are represented as follows.

$$V101 = V102 + \Delta V \tag{2}$$

$$V102 = V101 - \Delta V \tag{3}$$

Hence, the interterminal voltages V101 and V102 of the capacitors C101 and C102 can be expressed as follows.

$$V101=(V_{DD}/2)+(\Delta V/2) \quad (4)$$

$$V102=(V_{DD}/2)-(\Delta V/2) \quad (5)$$

Therefore, the voltage increase of the divided output voltage $V_{INT}$ generated by one connection switching is V101−V102=$\Delta V$.

Like this, the value of the divided output voltage $V_{INT}$ of the voltage drop circuit 1 is changed (it is assumed that the capacitors C101 and C102 are initially charged), as apparent from the waveform view in FIG. 5b. That is, in cycle 1, the discharge to the load circuit Z is started from the voltage $(\frac{1}{2})\cdot V_{DD}+(\Delta V/2)$ of the divided output voltage $V_{INT}$ and, when reaching the voltage of $(\frac{1}{2})\cdot V_{DD}-(\Delta V/2)$, the connection change of capacitor C101 to the lower side of the capacitor C102 is executed and then the voltage increases again to $(\frac{1}{2})\cdot V_{DD}+(\Delta V/2)$ to connect to the discharge in cycle 2.

Similarly, in the following, the charge and the discharge of the capacitors C101 and C102 are repeated between the voltages $(\frac{1}{2})\cdot V_{DD}+(\Delta V/2)$ and $(\frac{1}{2})\cdot V_{DD}-(\Delta V/2)$.

Next, the power consumed in the voltage divider section 10a in this embodiment will now be described.

First, in the conventional voltage drop circuit 120 described with reference to FIG. 1, when the current $I_D$ flows in the load circuit Z applied with the divided output voltage $V_{INT}$, a consumed power (or power consumption) $P_S$ at the FET 122 is obtained as follows.

$$P_S=(V_{DD}-V_{INT})\cdot I_D$$

Hence, assuming that $V_{INT}=(\frac{1}{2})\cdot V_{DD}$, $P_S=(\frac{1}{2})\cdot V_{DD}\cdot I_D$.

On the other hand, a power $P_2$ consumed by the voltage divider section 10a in the above-described embodiment is calculated (it is assumed that on-resistances of the switches S101 to S108 are very small and thus can be negligible and the capacities of the capacitors C101 and C102 are $C_U$ and $C_L$, respectively) as follows.

$$\begin{aligned} P_2 &= (1/2)\cdot(C_U+C_L)\cdot\{(V_{INTO}+(1/2)\cdot\Delta V)^2 - \\ &\quad (V_{INTO}-(1/2)\cdot\Delta V)^2\} \\ &= (C_U+C_L)\cdot V_{INTO}\cdot\Delta V \\ &= C_U\cdot V_{DD}\cdot\Delta V \end{aligned} \quad (6)$$

wherein $V_{INTO}=(\frac{1}{2})\cdot V_{DD}=\{C_U/(C_U+C_L)\}\cdot V_{DD}$.

While the divided output voltage $V_{INT}$ drops from the voltage $V_{INTO}+(\frac{1}{2})\cdot\Delta V$ to the voltage $V_{INTO}-(\frac{1}{2})\cdot\Delta V$, the quantity Q of electric charges that the voltage $V_{DD}$ supplies to the voltage divider section 10a is Q=$C_U\cdot\Delta V$. Assuming that the time required for supplying this electric charge is $\Delta t$, the current I flowing from the $V_{DD}$ to the voltage divider section 10a is I=Q/$\Delta t$=$C_U\cdot\Delta V/\Delta t$. Hence, the power that the $V_{DD}$ supplies to the voltage divider section 10a is $V_{DD}\cdot I$= $((C_U\cdot\Delta V/\Delta t)\cdot V_{DD}$ and the energy given during $\Delta t$ second is $C_U\cdot V_{DD}\cdot\Delta V$.

Therefore, the consumption power $P_E$ in due consideration of the charge current of the first capacitor C101 is represented as follows.

$$P_E=C_U\cdot V_{DD}\cdot\Delta V \quad (7)$$

Since the consumption power of the voltage divider section 10a is given by $P_E-P_2$, $P_E-P_2=C_U\cdot V_{DD}\cdot\Delta V - C_U\cdot V_{DD}\cdot\Delta V=0$.

Figure 2:
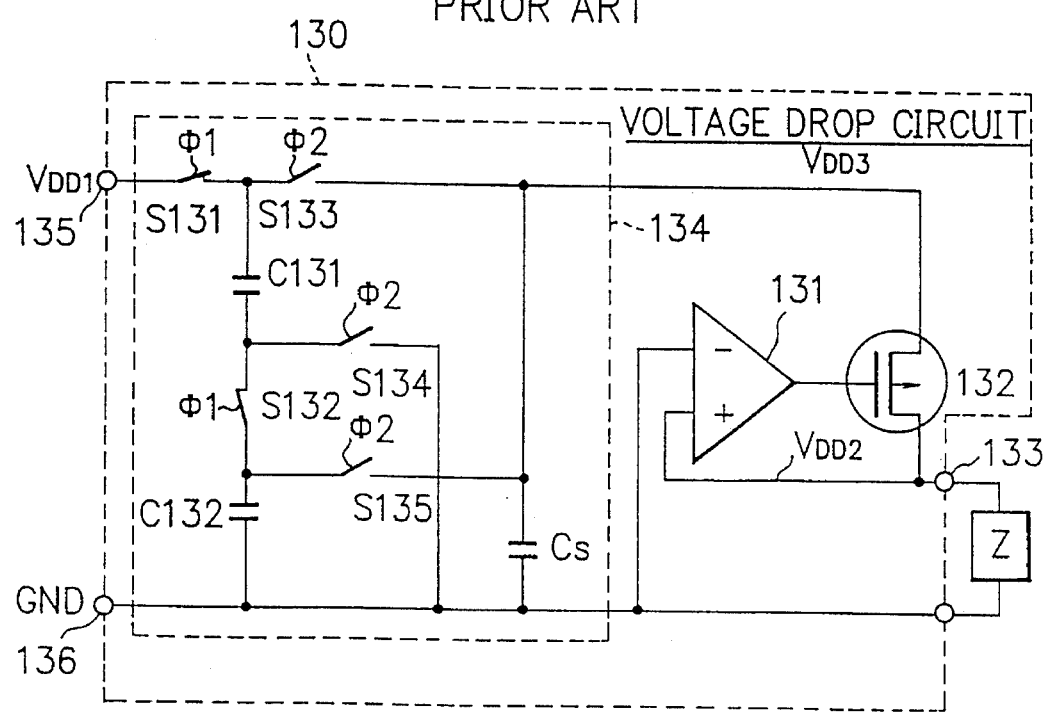
FIG. 2 is a block diagram of another conventional voltage drop circuit.
Figure 3A:
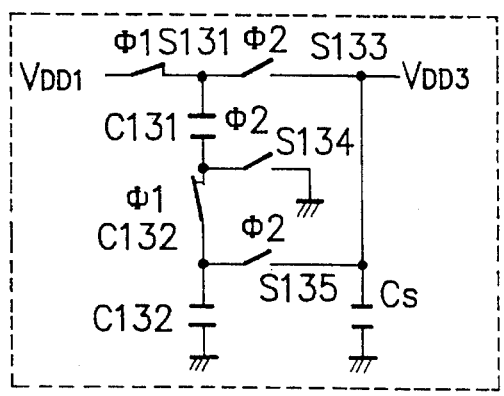
FIG. 3a is a circuit diagram showing an equivalent circuit of the conventional circuit shown in FIG. 2
Figure 3A:
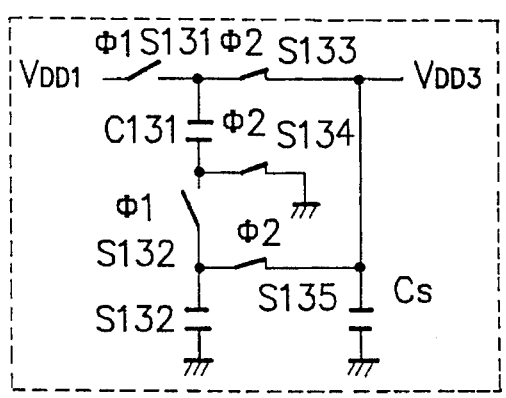
Figure 3A:
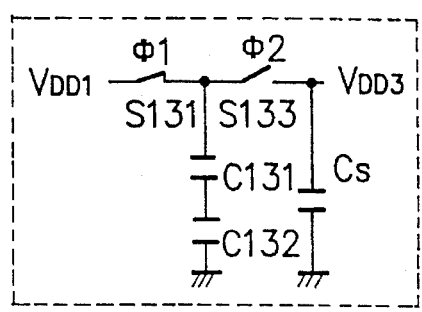
Figure 3A:
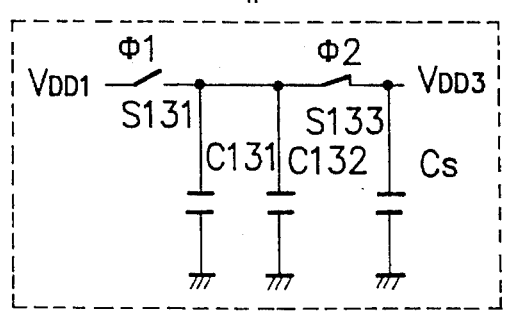

Hence, when the resistances of the FET switches are negligibly small, the power consumption of the voltage divider section 10a becomes substantially zero. That is, the consumption power is less than the case of the conventional voltage drop circuit 180 shown in FIG. 2.

Further, the capacitors C101 and C102 in this embodiment, one in the state of the charge and the other in the state of the discharge, supply the electric charge to the load circuit Z during both the aforementioned cycle 1 and cycle 2. In the above-described conventional example 130, as described above, the voltage divider circuit 184 supplies the electric charge to the load circuit Z from the capacitor $C_S$ at the charge time and supplies the electric charge to the load circuit Z from the capacitors C101 and C102 only at the discharge time. Hence, as compared with this conventional example, the utilization efficiency of the capacitors in this embodiment is high. Also, in comparison with the conventional voltage divider circuit 134 requiring a large capacity of the internal capacitor $C_S$, in this embodiment, as described above, it is sufficient to use a certain extent of the wiring capacity from the voltage drop circuit 1 to the load circuit Z.

In this embodiment, although the number of the capacitors inserted in series between the external power source terminal 13 and the earth voltage point in the voltage divider section 10a is two as an optimum value, of course, more than two number can be possible. Further, each of these capacitors can be composed of a plurality of element capacitors connected in parallel.

In the voltage drop circuit 1 of this first embodiment, when the connection switching of the capacitors is carried out at a very short period, its divided output voltage $V_{INT}$ is stabilized to $(\frac{1}{2})\cdot V_{DD}$, as described above. Since this voltage is changed by the variation of the $V_{DD}$, in case that the comparison reference voltage $V_{REF}$ input to the input terminal (+) of the voltage comparator 11 is constant, the shift between the stable point of the divided output voltage $V_{INT}$ and the comparison reference voltage $V_{REF}$ becomes large and thus the normal connection switching can not be carried out.

Hence, the comparison reference voltage $V_{REF}$ in FIG. 4a is generated from the external power source voltage $V_{DD}$ by the resistors R11 and R12 so that the comparison reference voltage $V_{REF}$ may be slightly lower than $(\frac{1}{2})\cdot V_{DD}$, by a potential difference $\Delta V$, and thus, even when the voltage $V_{DD}$ is varied, the connection switching can be performed at a suitable timing. In the voltage drop circuit shown in FIG. 4a, the setting is carried out so that the comparison reference voltage $V_{REF}$ may be $(\frac{1}{2})\cdot V_{DD}-\Delta V_1$ and the resistance values of the resistors R11 and R12 may satisfy the following ratio.

$$R11/R12=2\cdot V_{DD}/\{(V_{DD}-2)\cdot\Delta V_1\}-1 \quad (12)$$

These resistors R11 and R12 can be composed of diodes when the stability of the voltage $V_{DD}$ is high. However, in general, the variation of the voltage $V_{DD}$ is large and thus it is convenient to use resistors which readily track the variation. Further, in order to control the current as small as possible, the resistance values of these resistors are determined to at least 1M ohms.

Figure 6A:
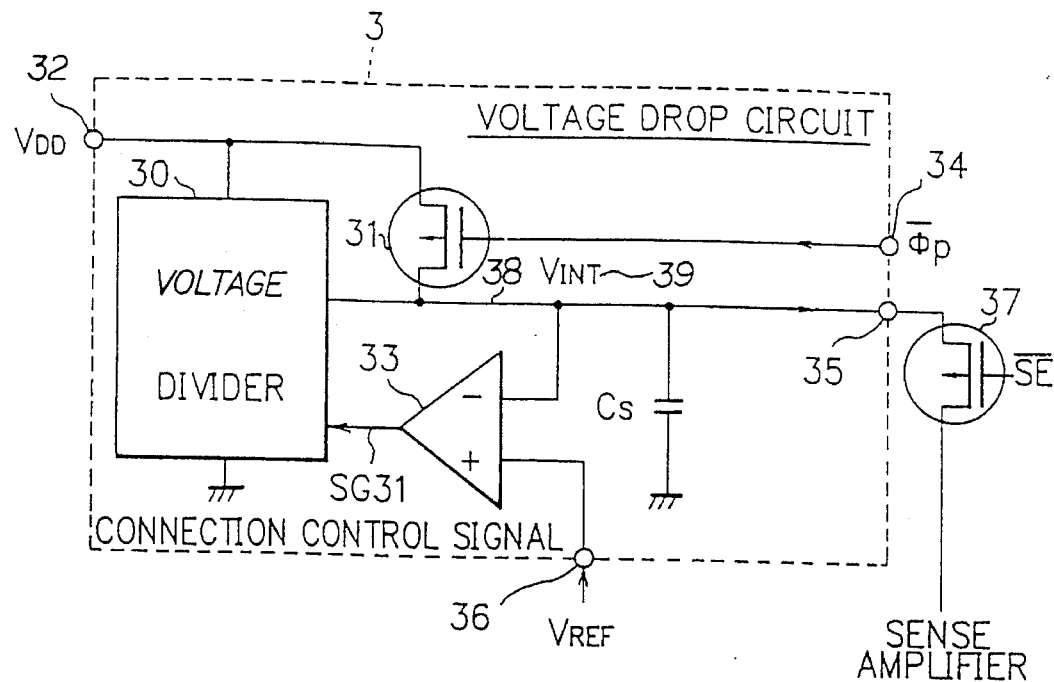
Figure 6B:
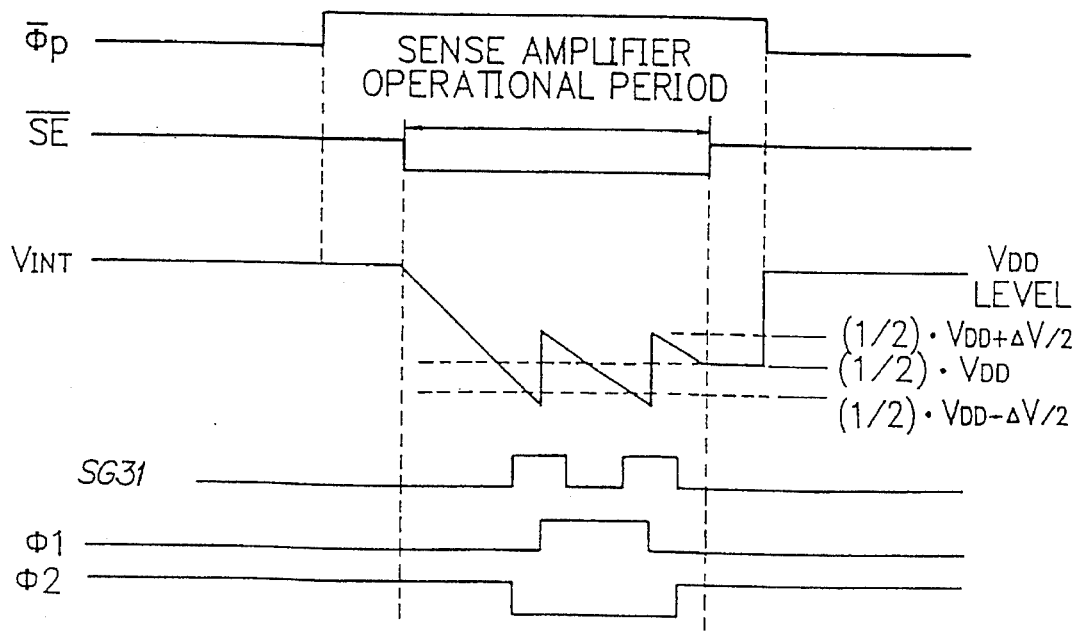

FIG. 6a illustrates the second embodiment of a voltage drop circuit according to the present invention and FIG. 6b shows a time chart including waveforms for explaining the operation of the voltage drop circuit shown in FIG. 6a. In this embodiment, it is clear that the voltage drop circuit 3 can be readily applied to a dynamic random access memory (DRAM).

As shown in FIG. 6a, the voltage drop circuit 3 is comprised of a voltage divider 30, a voltage comparator 33 for supplying a connection control signal SG31 to the voltage divider 30, an FET switch 31 which inputs the external power source voltage $V_{DD}$ at the source electrode and an inverted precharge drive signal $\Phi_p$ B at the gate electrode via a terminal 34, and a stabilizing capacitor $C_S$ whose one end is connected to the earth voltage point. The voltage divider 30 has the same construction as the aforementioned voltage divider 10. The comparison reference voltage $V_{REF}$ is applied through a terminal 32 to one input terminal (+) of the voltage comparator 33 and the divided output voltage $V_{INT}$ is applied through an output line 38 having a node 39 connected to another input terminal (−) of the voltage comparator 33, the drain electrode of the FET switch 31 and the other end of the stabilizing capacitor $C_S$. In turn, when the FET switch 81 is the on-state in response to the precharge drive signal $\Phi_p$ B, the divided output voltage $V_{INT}$ for leading the voltage $V_{DD}$ supplied from an external power source terminal 86 to a divided voltage output terminal 85 is supplied to the source electrode of an FET 37 whose drain electrode is connected to a sense amplifier (not shown) and which inputs a sense enable signal SEB or SE (an inverted signal of SE) at the gate electrode, via the divided voltage output terminal 35.

The operation start of the sense amplifier of the DRAM is accompanied with a momentary heavy-current and thus an insufficient current supply state is often caused. Hence, the FET switch 81 is turned on by the low level of the inverted precharge drive signal $\Phi_p$ B synchronizing with the non-operational period (the period that SEB is the high level) of the sense amplifier and the external power source voltage $V_{DD}$ is supplied to the FET 37 as it is.

Right before coming into the operational period of the sense amplifier, that is, by making the inverted precharge drive signal $\Phi_p$ B to the high level at the state that the sense enable signal SEB is the high level and the FET 37 is off, the FET switch 81 is turned off. In this state, the node 39 supplied with the divided output voltage $V_{INT}$ is isolated from the terminal 84 of the power source voltage $V_{DD}$ as well as from the sense amplifier connected to the FET 37 to become a floating but the voltage thereof is held to the level of the power source voltage $V_{DD}$. When the inverted sense enable signal SEB becomes the low level, the FET 37 is conducted and the potential at the node 39 of the divided output voltage $V_{INT}$ is supplied to the sense amplifier. With the driving of the sense amplifier, the voltage of the divided output voltage $V_{INT}$ gradually drops and, when reaching the level of the comparison reference voltage $V_{REF}=(½)V_{DD}$, the control pulses $\Phi1$ and $\Phi2$ in the voltage divider 30 are generated in response to the connection control signal SG31 output from the voltage comparator 33. As a result, the divided output voltage $V_{INT}$ increases up to $(½)·V_{DD}+(½)·\Delta V$. At this time, since the inverted precharge drive signal $\Phi_p$ B is the high level, the FET switch 31 is still off and the divided output voltage $V_{INT}$ is not reached the level of the power source voltage $V_{DD}$. Next, the discharge to the sense amplifier is executed and this charge and discharge are repeated until the inverted sense enable signal SEB becomes the high level again. While the inverted sense enable signal SEB is the high level and the inverted precharge drive signal $\Phi_p$ B is also the high level, the level of the divided output voltage $V_{INT}$ at the time point when the inverted sense enable signal SEB becomes the high level is held. Then, when the precharge drive signal $\Phi_p$ B becomes the low level again, the FET switch 31 is turned on and the divided output voltage $V_{INT}$ increases to the power source voltage $V_{DD}$ level. Hence, while the inverted sense enable signal SEB is the low level, the supply voltage level to the sense amplifier is stabilized near $(½)·V_{DD}$. As described above, only in the precharge period right before the sense enable signal SE actuates the sense amplifier, the external power source voltage $V_{DD}$ is supplied to the DRAM side to accelerate the precharge operation of the memory cells.

Figure 7A:
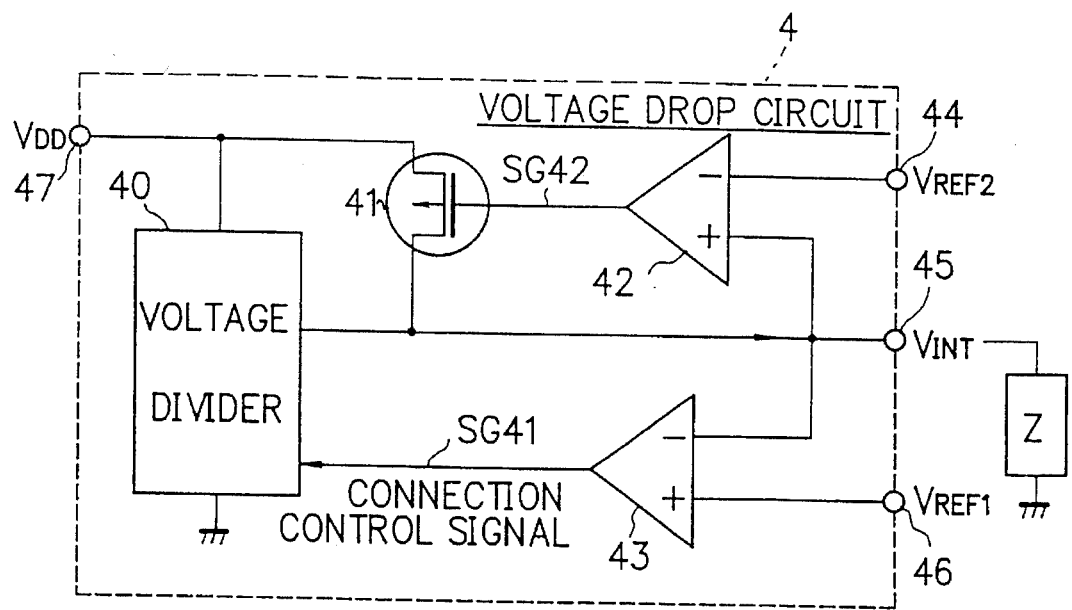
Figure 7B:
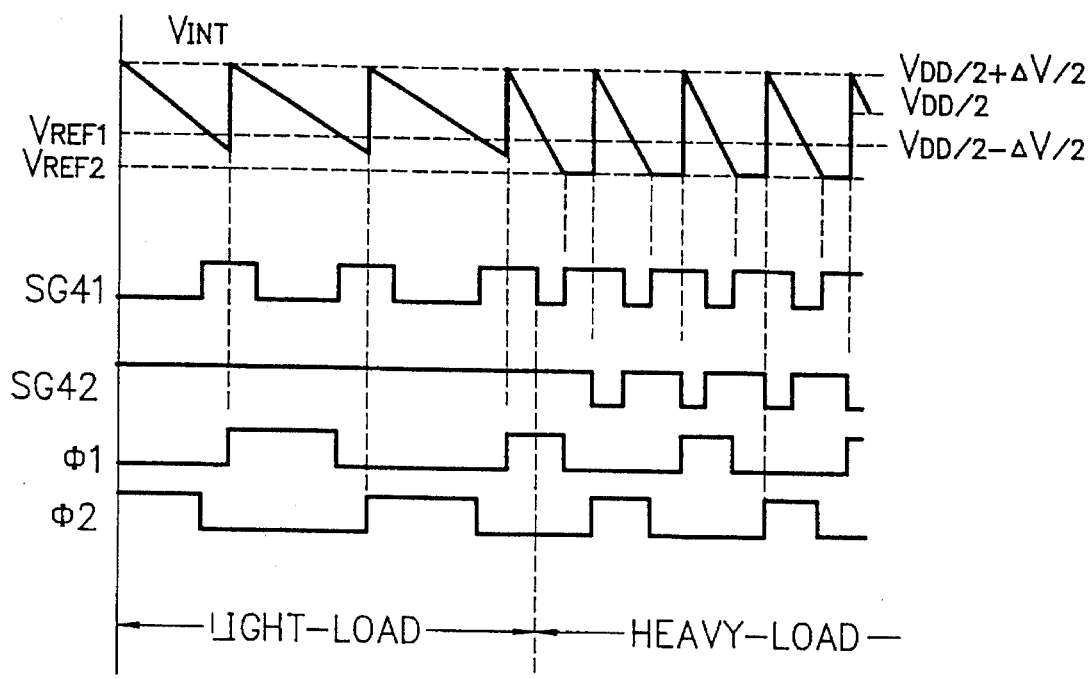

FIG. 7a illustrates the third embodiment of a voltage drop circuit according to the present invention and FIG. 7b shows a time chart including waveforms for explaining the operation of the voltage drop circuit shown in FIG. 7a.

In this embodiment, as shown in FIG. 7a, the voltage drop circuit 4 is comprised of a voltage divider 40 having a similar construction as the above-described voltage divider 10, a voltage comparator 43 for supplying a connection control signal SG41 to the voltage divider 40, an FET 41 which is inserted between a power source terminal 47 and an output terminal 45 and supplies a level of a voltage $(½)·V_{DD}$ to the output terminal 45, and another voltage comparator 42 for supplying a signal SG42 to the gate electrode of the FET 41. In this case, a first comparison reference voltage $V_{REF1}$ is applied to one input terminal (+) of the voltage comparator 43 from a terminal 46 and a second comparison reference voltage $V_{REF2}$ is applied to one input terminal (−) of the voltage comparator 42 from a terminal 44. The divided output voltage $V_{INT}$ output from the voltage divider 40 is applied to another input terminal (−) of the voltage comparator 43, another input terminal (+) of the voltage comparator 42 and the output terminal 45 connected thereto and also the external power source voltage $V_{DD}$, under the on-state of the FET 41, is supplied to the another input terminals (−) and (+) of the voltage comparators 43 and 42, respectively, and to the output terminal 45. A load circuit Z is connected to the output terminal 45. As apparent from FIG. 7a, in this embodiment, one voltage drop circuit of the conventional embodiment shown FIG. 1 is added to the first embodiment of the voltage drop circuit shown in FIG. 4a, and the first comparison reference voltage $V_{REF1}$, can be higher than the second comparison reference voltage $V_{REF2}$. In this embodiment, the FET 41 possesses a sufficient value of on-resistance so as to make the external power source voltage $V_{DD}$ to be $(½)·V_{DD}+(½)·\Delta V$.

In this embodiment, the voltage divider 40 intends to dissolve the restriction to the current supply capability due to the shortening of the connection switching period with the increase of the supply current to the load circuit Z. That is, the voltage drop circuit composed of the FET 41 and the voltage comparator 42 is combined with and arranged in parallel with the voltage divider 40 so as to prevent the level drop of the divided output voltage $V_{INT}$ in the period of the supply current increase to the load circuit Z. In other words, by determining the first comparison reference voltage $V_{REF1}$ higher than the second comparison reference voltage $V_{REF2}$, in a light-load operation mode where a light current is applied to the load circuit Z, the divided output voltage $V_{INT}$ is held higher than the second comparison reference voltage $V_{REF2}$ to hold the signal SG42 the high level to maintain the off-state of the FET 41. That is, in this period, the output of the voltage divider 40 constitutes the divided output voltage $V_{INT}$ (a period of 'light-load' in FIG. 7b). On the other hand, in a heavy-load operation mode where a heavy-current is applied to the load circuit Z, the divided output voltage $V_{INT}$ is below the second comparison reference voltage $V_{REF}$ and the output signal SG42 of the voltage comparator 42 is the low level. Hence, the FET 41 is on and the voltage of the divided output voltage $V_{INT}$ on the output terminal 45 connected to the drain electrode of the FEt 41 is increased up to the level of $(½)·V_{DD}+(½)·\Delta V$ (a period of 'heavy-load' in FIG. 7b).

Figure 8A:
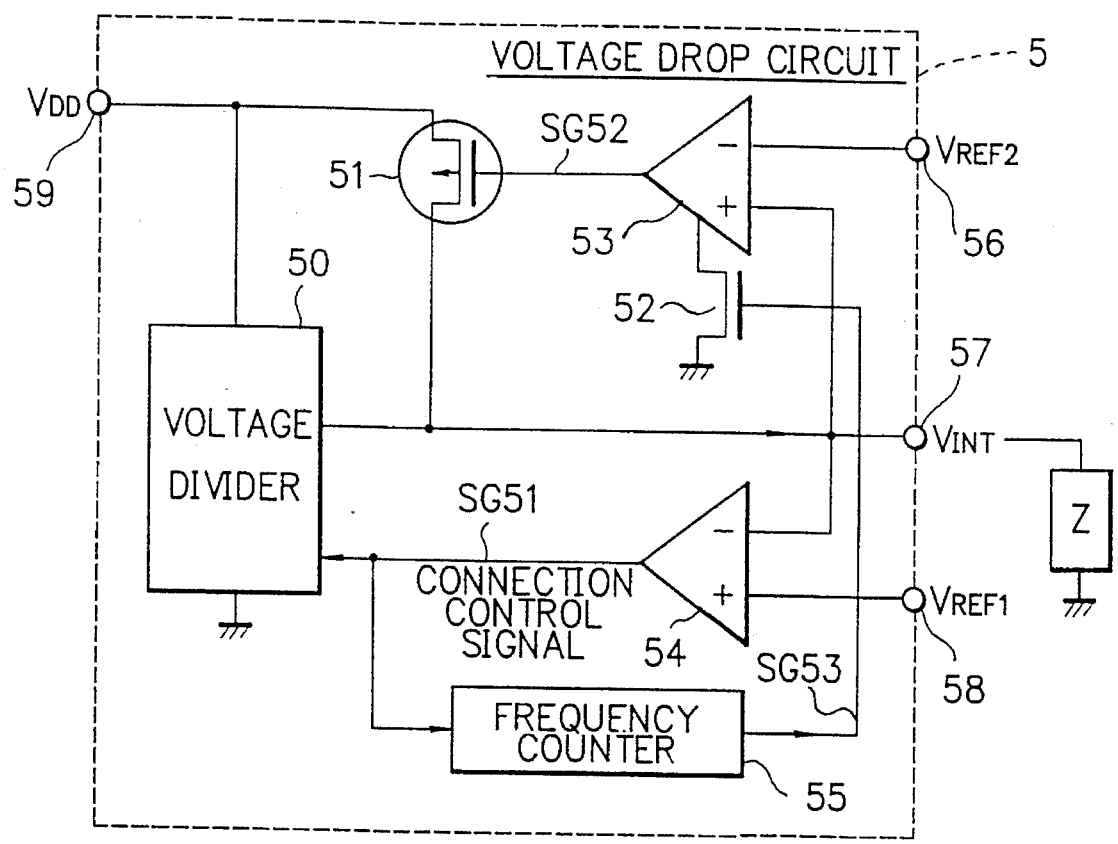
Figure 8B:
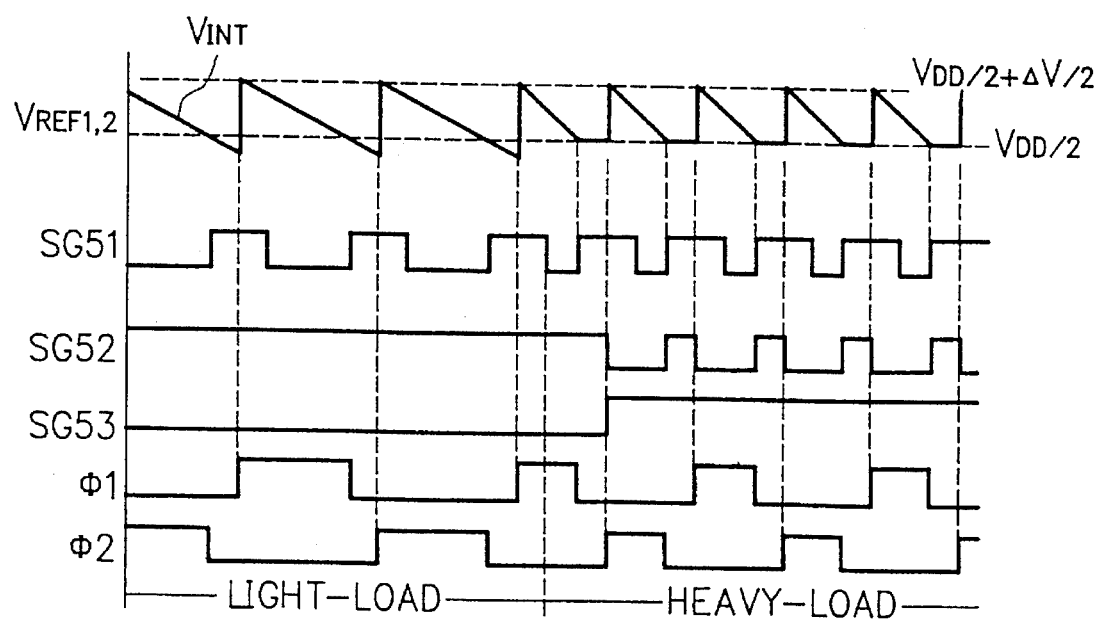

FIG. 8a illustrates the fourth embodiment of a voltage drop circuit according to the present invention and FIG. 8b shows a time chart including waveforms for explaining the operation of the voltage drop circuit shown in FIG. 8a.

In this embodiment, the voltage drop circuit 5 has substantially the same construction as the voltage drop circuit 4 shown in FIG. 7a, except that a frequency counter 55 counts down pulses of a connection control signal SG51 output from a voltage comparator 54 and an FET 52 selectively grounds an earth terminal of another voltage comparator 53 in response to an output signal SG53 of the frequency counter 55.

In this embodiment, the frequency counter 55 counts the pulses of the connection control signal SG51 output from the voltage comparator 54 and, when its period becomes shorter the a predetermined value, the frequency counter 55 outputs the signal SG53 of the high level representing the heavy-load mode. In response to this signal SG53, the FET 52 is turned on to change an output signal SG52 of the voltage comparator 53 to the low level and make an FET 51 to be on-state and to increase a voltage on an output terminal 57 to a level of $(1/2) \cdot V_{DD} + (1/2) \cdot \Delta V$.

Figure 9:
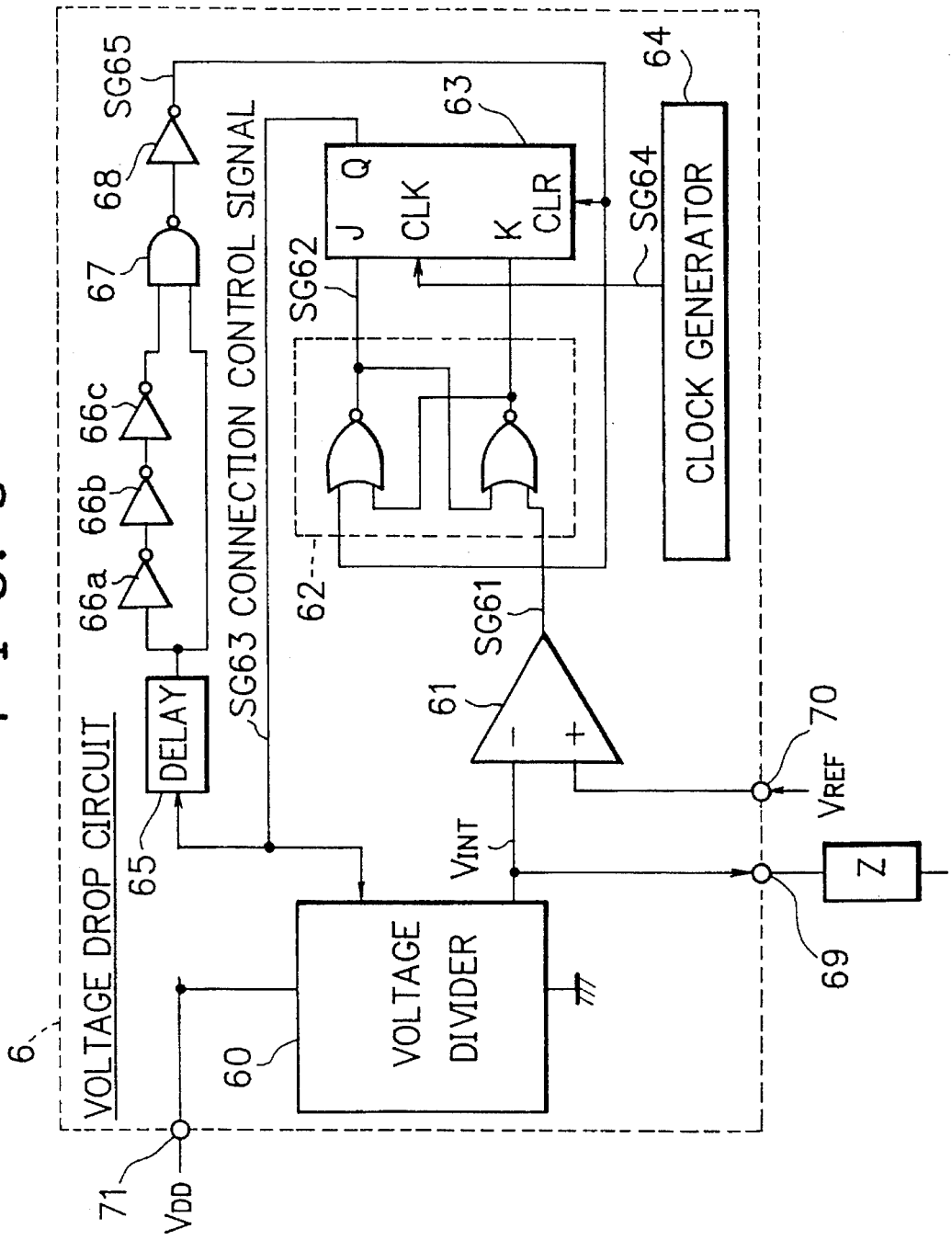
FIG. 9 is a block diagram of a fifth emvbodiment of a voltage drop circuit according to the present invention.

FIG. 9 illustrates the fifth embodiment of a voltage drop circuit according to the present invention and FIG. 10 shows a time chart including waveforms for explaining the operation of the voltage drop circuit shown in FIG. 9.

In this embodiment, as shown in FIG. 9, the voltage drop circuit 6 is comprised of a voltage divider 60 having the same construction as the above-described voltage divider 10, a voltage comparator 61, a flip-flop circuit 62 which inputs an output signal SG61 of the voltage comparator 61, a JK flip-flop circuit 63 which is subordinately connected to the flip-flop circuit 62, a clock generator 64 for supplying a clock SG64 to the JK flip-flop circuit 63, a delay circuit 65 which inputs a connection control signal SG63 of the JK flip-flop circuit 63, a and a combination circuit composed of three inverters 66a, 66b and 66c connected in series, an NAND circuit 67 and an inverter 68, which inputs an output signal of the delay circuit 65 and generates a reset signal SG65 for clearing the flip-flop circuit 62 and the JK flip-flop circuit 63. A comparison reference voltage $V_{REF}$ is applied to one input terminal (+) of the voltage comparator 61 from a terminal 70 and a divided output voltage $V_{INT}$ is applied to another input terminal (−) of the voltage comparator 61 from the voltage divider 60. The divided output voltage $V_{INT}$ is supplied to a load circuit Z via an output terminal 69.

In FIG. 10, the divided output voltage $V_{INT}$ drops below the comparison reference voltage $V_{REF}$. When the output signal SG61 of the voltage comparator 61 becomes the high level, the connection control signal SG63 is generated in synchronism with the leading edge of the clock SG64 generated right after the change of the signal SG61 from the low level to the high level. In case of a short charge time corresponding to the high level period of the connection control signal SG68, the current supply capability of the voltage divider 60 drops. However, in the voltage drop circuit 6, the connection switching is executed in synchronism with the leading edge of the clock SG64 and thus a connection switching of a heavy number of voltage drop circuits can be carried out at a fixed interval.

In this case, the rise of the signal SG61 to the high level is stored in the RS flip-flop circuit 62 in response to its leading edge and an output signal SG62 of the flip-flop circuit 62 is input to the J terminal of the JK flip-flop circuit 63. Hence, even when the voltage comparator 61 is reset by a power source noise or the like to change the signal SG61 to the low level before the execution of the connection switching, the stored contents of the flip-flop circuit 62 is not changed and the output signal SG62 is held to the high level. Next, the output signal SG62 is stored in the JK flip-flop circuit 63 in synchronism with the leading edge of the clock SG64 and the connection control signal SG63 as its output signal is generated. By the control pulses Φ1 and Φ2 generated in response to this connection control signal SG63, the charge of the voltage divider 60 is carried out and the divided output voltage $V_{INT}$ is increased to $(1/2) \cdot V_{DD} + (1/2) \cdot \Delta V$. On the other hand, the connection control signal SG63 delayed in the delay circuit 65 is input to the combination circuit composed of the inverters and the NAND circuit and the combination circuit generates one shot of the reset signal SG65. The flip-flop circuit 62 and the JK flip-flop circuit 63 are reset in synchronism with the leading edge of the reset signal SG65 and as a result, the output signal SG62 and the connection control signal SG63 are changed to the low level to finish the connection control period. At the same time, the capacitors of the voltage divider 60 are come into the discharge period and the divided output voltage drops.

Figure 14:
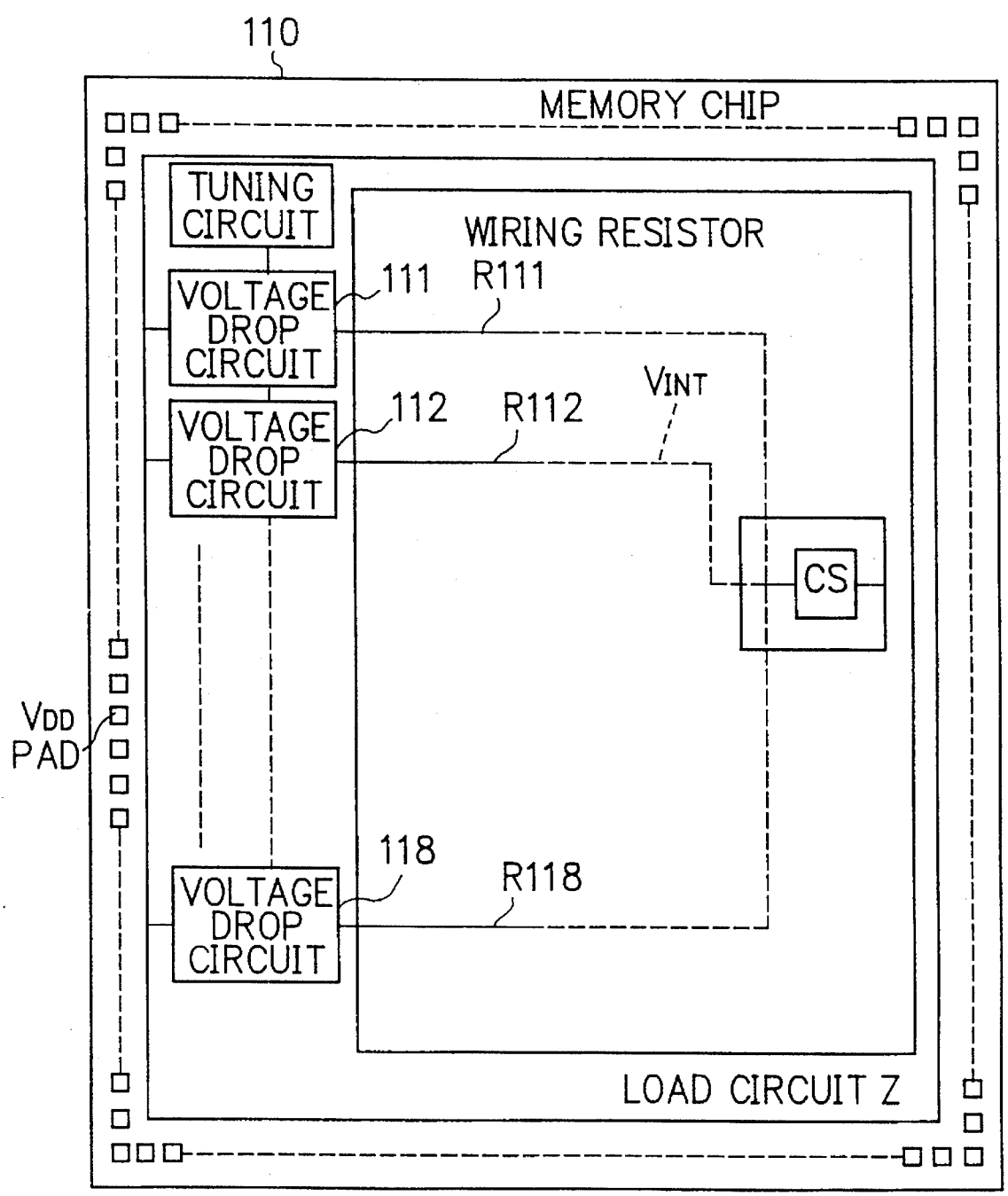
FIG. 14 is a schematic diagram showing a rough arrangement of the fifth embodiment of the voltage drop circuit shown in FIG. 6, a plurality of which are built in an IC chip for showing an applied example of the present invention.

In a 16-Mb DRAM, approximately 8 voltage drop circuits 6 are built in a chip. In FIG. 14, there is shown one embodiment of an arrangement of circuits on a heavy capacity DRAM chip with a plurality of built-in voltage drop circuits 6.

In FIG. 14, the divided output voltages $V_{INT}$ of 8 voltage drop circuits (the same as the above-described voltage drop circuit 6) 111 to 118 are connected in common to the stabilizing capacitor $C_S$ via respective wiring elements R111 to R118 and are supplied from its common connection point to the load circuit Z which is constituted by internal circuits including the heavy capacity DRAM. A plurality of wirings from the voltage drop circuits to the load circuit Z are independently provided and by their wiring resistances, the mutual influences between the voltage drop circuits can be reduced. Hence, the outputs of the voltage drop circuits with the high divided output voltages $V_{INT}$ can prevent the charging of the capacitors of the voltage drop circuits with the low divided output voltages $V_{INT}$. The timings of the connection control signals required for the voltage drop circuits 111 to 118 can be independently generated in the respective voltage drop circuits 111 to 118 and alternatively, can be supplied in common by a pulse source equivalent to the clock generator 64 of the voltage drop circuit 6 described above. In place of providing in the respective voltage drop circuits 111 to 118, the stabilizing capacitor or capacitors C s can be arranged near the load circuit Z to prevent a reverse charge to the voltage drop circuits 111 to 118. Also, the voltage drop circuits 111 to 118 are arranged near the external power source terminals of the power source voltages $V_{DD}$ and the variation of the power source voltages $V_{DD}$ after supplied within the chip can be controlled.

Figure 11:
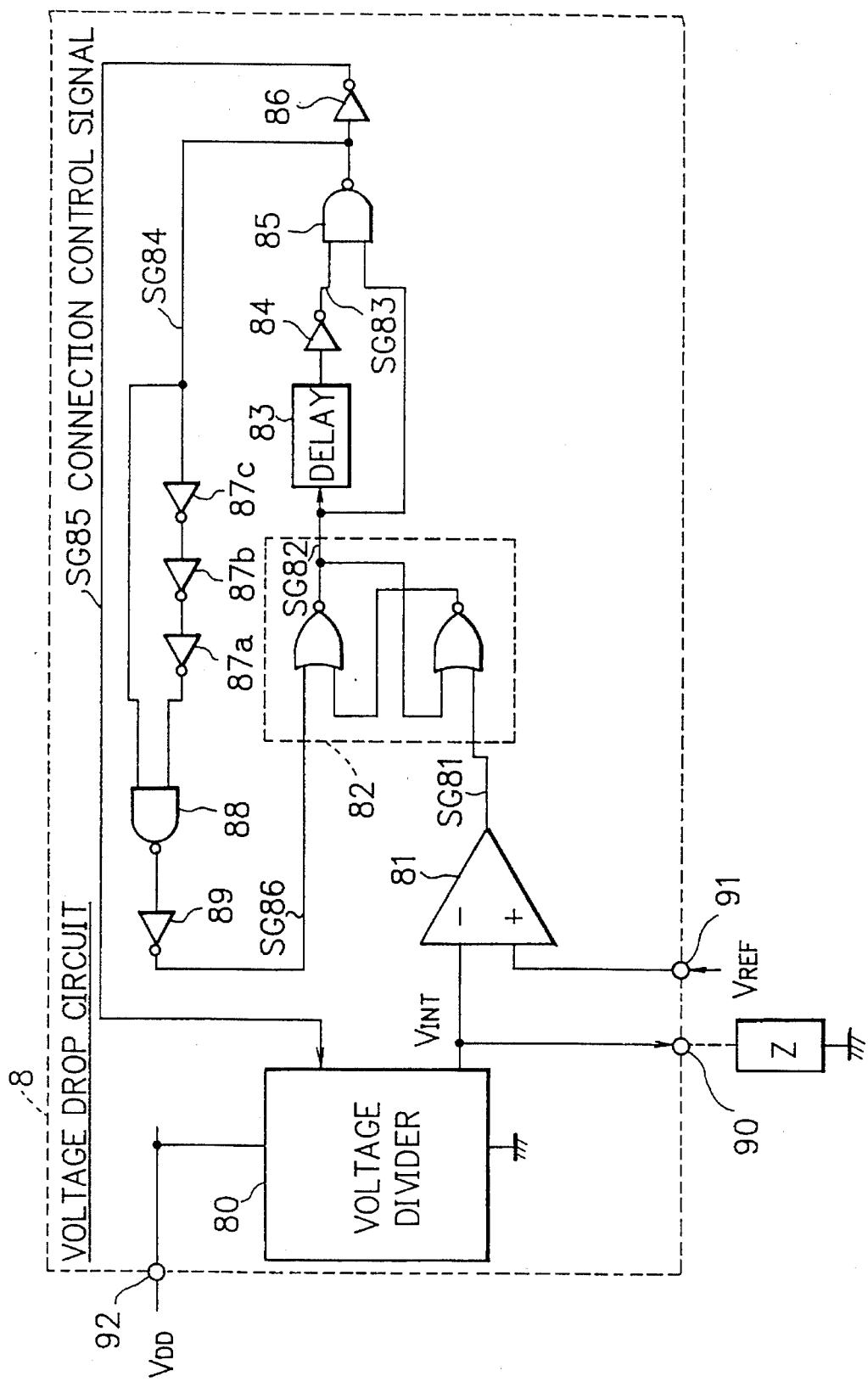
FIG. 11 is a block diagram of a sixth embodiment of a voltage drop circuit according to the present invention.
Figure 12:
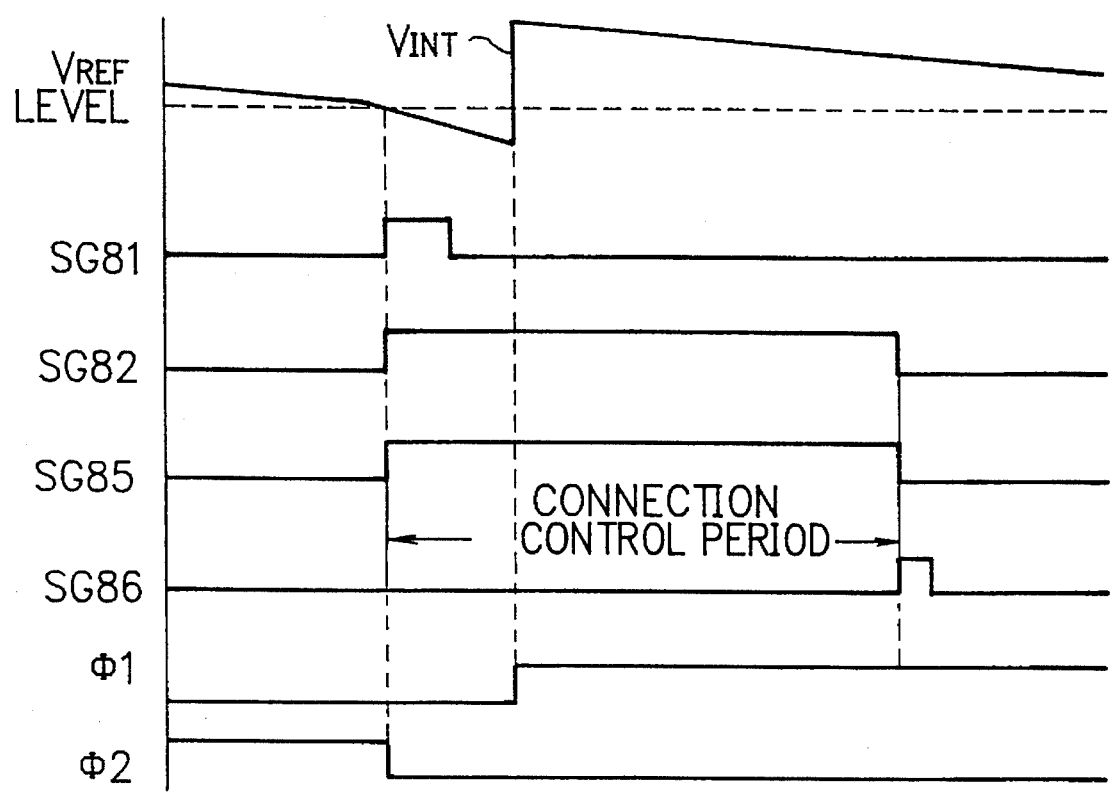
FIG. 12 is a time chart for explaining an operation of the circuit shown in FIG. 11.

FIG. 11 illustrates the sixth embodiment of a voltage drop circuit according to the present invention and FIG. 12 shows a time chart including waveforms for explaining the operation of the voltage drop circuit shown in FIG. 11. This embodiment is a modification of the fifth embodiment shown in FIG. 9.

In this embodiment, the voltage drop circuit 8 is comprised of a voltage divider 80 having the same construction as the above-described voltage divider 10, a voltage comparator 81, a flip-flop circuit 82 which inputs an output signal SG81 of the voltage comparator 81, a combination circuit composed of a delay circuit 83, an inverter 84, a NAND circuit 85 and another inverter 86. The combination circuit converts an output signal SG82 of the flip-flop circuit 82 into signals SG84 and SG85 hereinafter described, and one shot pulse generator circuit composed of three inverters 87a, 87b and 87c, a NAND circuit 88 and an inverter 89, which generates a reset signal SG86 to be sent to the flip-flop circuit 82 from an output signal SG84 of the NAND circuit 85. In this case, the inverter 86 inputs the output signal SG84 of the NAND circuit 85 and outputs a connection control signal SG85 to be supplied to the voltage divider 80. On the other hand, the comparison reference voltage $V_{REF}$ and the divided output voltage $V_{INT}$ are applied to respective input terminals (+) and (−) of the voltage comparator 81 and the divided output voltage $V_{INT}$ is supplied to the load circuit Z via an output terminal 90.

In FIG. 12, the divided output voltage $V_{INT}$ drops below the comparison reference voltage $V_{REF}$ and, when the signal SG81 becomes the high level, in synchronism with its leading edge, the signal SG82 is output from the RS flip-flop circuit 82. Even when the voltage comparator 81 is reset by a power source noise or the like to change the signal SG81 to the low level before the execution of the connection switching, the output signal SG82 is held to the high level. The output signal SG82 of the flip-flop circuit 82 on the one hand is input to the NAND circuit 85 and on the other hand is delayed in the delay circuit 83 of which an output is fed to the inverter 84. The inverter 84 outputs an delayed inverted signal SG83. The signal SG83 is successively supplied to the NAND circuit 85 which outputs as the signal SG84 a resultant signal from a NAND operation between the signals SG82 and SG83. The signal SG84 is input to the inverter 86 and the inverter 86 outputs the connection control signal SG85 to the voltage divider 80. By the control pulses Φ1 and Φ2 generated in response to the connection control signal SG85, the connection switching is executed in the voltage divider 80 and the divided output voltage $V_{INT}$ is increased to $(½)·V_{DD}+(½)·ΔV$. On the other hand, the signal SG84 is kept in the high level in the period determined by the delay time in the delay circuit 83 and thus the next connection switching can not be carried out until this signal SG84 becomes the low level. Further, the signal SG84 is converted into one shot pulse signal or the reset signal SG86 in the one shot pulse generator circuit. In synchronism with the leading edge of this reset signal SG86, the flip-flop circuit 82 is reset, and the signal SG82 is changed to the low level to input the next signal SG81. Hence, by the voltage drop circuit 8, the mutual time intervals of the connection control periods can be spread more than a predetermined value and the drop of the efficiency of the voltage drop circuit can be avoided.

Figure 13A:
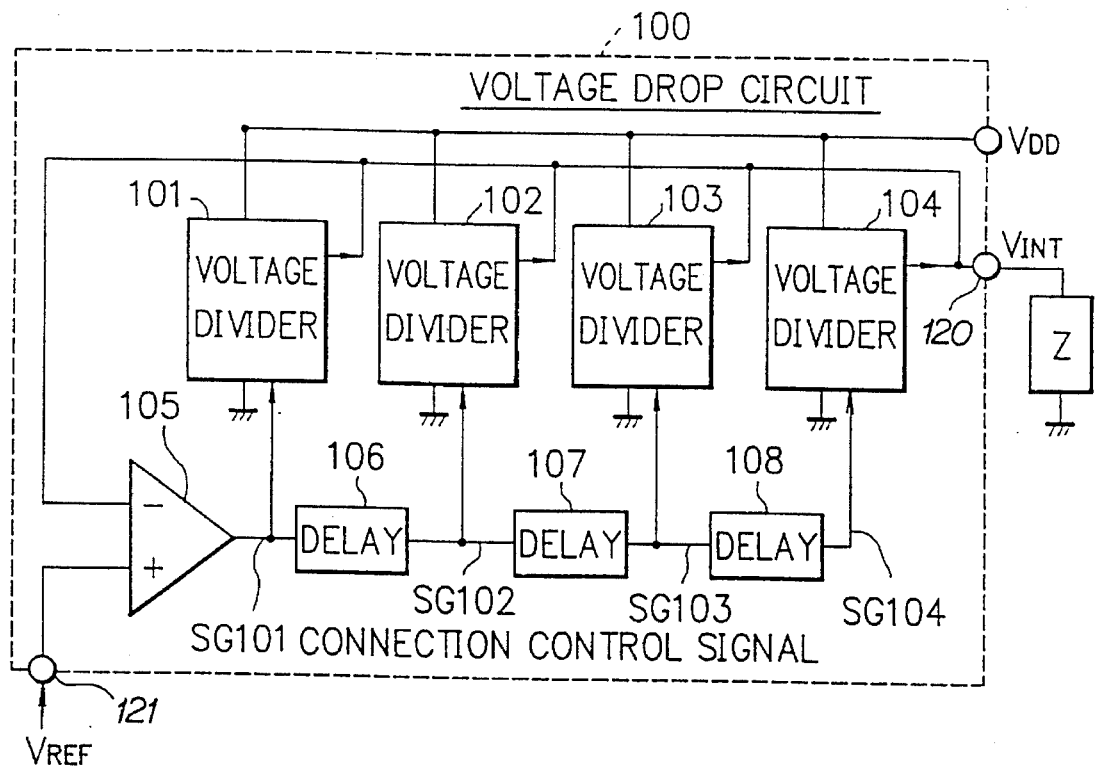
Figure 13B:
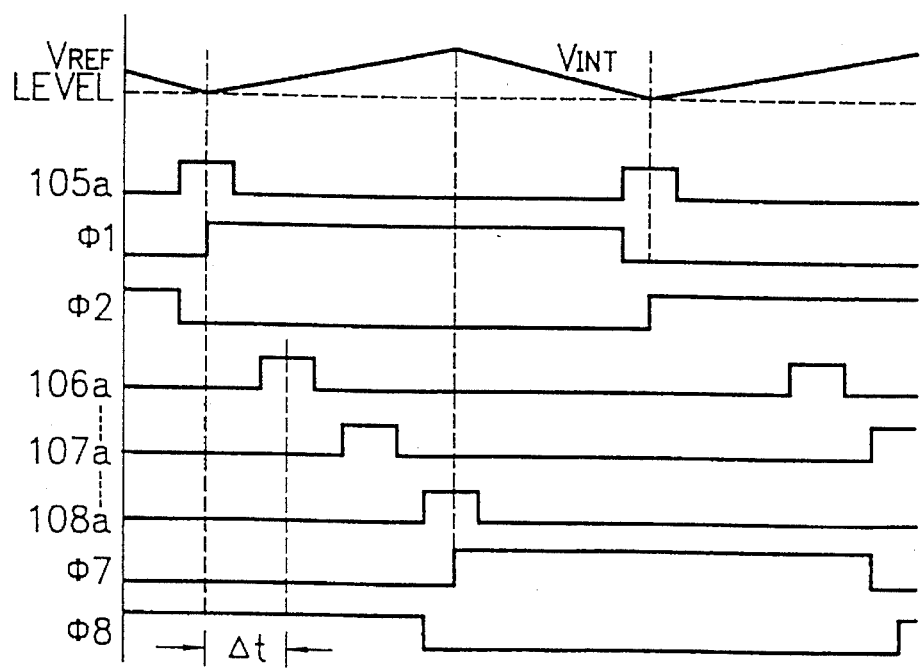

FIG. 13a illustrates the seventh embodiment of a voltage drop circuit according to the present invention and FIG. 13b shows a time chart including waveforms for explaining the operation of the voltage drop circuit shown in FIG. 13a.

In this embodiment, as shown in FIG. 13a, the voltage drop circuit 100 includes a voltage comparator 105, a first voltage divider 101 inputting an output signal SG101 of the voltage comparator 105, first, second and third delay circuits 106, 107 and 108 which are connected in series so as to give a predetermined delay time Δt to the input signal SG101 for each, a second voltage divider 102 inputting an output signal SG102 of the first delay circuit 106, a third voltage divider 103 inputting an output signal SG103 of the second delay circuit 107, and a fourth voltage divider 104 inputting an output signal SG104 of the third delay circuit 108. The divided output voltages $V_{INT}$ of the four voltage dividers 101 to 104 are applied in common to one input terminal (−) of the voltage comparator 105 and the comparison reference voltage $V_{REF}$ is applied to another input terminal (+) of the voltage comparator 105 from a terminal 121. The divided output voltages $V_{INT}$ are supplied to the load circuit Z via an output terminal 120.

As shown in FIG. 13b, since the connection control signal SG101 is delayed by a certain time Δt in the delay circuits 106 to 108, the switching of the charge and the discharge in the first to fourth voltage dividers 101 to 104 is executed at mutually shifted time positions. Hence, while one of the first to fourth voltage dividers 101 to 104 is in the connection switching operational state, the other voltage dividers function as stabilizing capacitor elements. In this embodiment, by determining the delay time Δt to a longer time than the required time for the above-described connection switching in one voltage drop circuit, a mutual charge among a plurality of voltage drop circuits by the divided output voltages $V_{INT}$ can be prevented. As apparent to those skilled in the art, two voltage drop circuits can be provided in this embodiment.

As described above, according to the present invention, in the voltage drop circuit to be built in an IC chip or the like, since a capacitor with no power loss as a circuit element for a divided voltage is used, heat generation can be prevented and this circuit is suitable for a heavy scaled LSIs. Further, since these circuit wiring elements for the divided voltages function as stabilizing capacitors, these are further effective for stabilizing the divided output voltages. Moreover, in this voltage divider, since the utilization efficiency of the capacitors for the voltage dividing is raised, the occupying area of the capacitors on the IC chip can be saved to improve the integration degree.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A voltage step-down circuit formed in a semiconductor integrated circuit including a load circuit operable with a stepped-down voltage from an external power source voltage, said voltage step-down circuit comprising:

a voltage dividing circuit for dividing said power source voltage to obtain said stepped-down voltage, said voltage dividing circuit comprising:

an input terminal for receiving said power source voltage;

an output terminal for applying said stepped-down voltage to said load circuit;

a first capacitor operatively coupled to said input terminal, said first capacitor having a first electrode and a second electrode cooperative with each other for establishing a first capacitance;

a second capacitor operatively coupled to said input terminal, said second capacitor including a third electrode and a fourth electrode cooperative with each other for establishing a second capacitance equivalent to said first capacitance;

a common electrode operatively coupled to said first capacitor and said second capacitor, said common electrode having a ground voltage;

a plurality of switches comprising:

a first switch for opening and closing an interconnection between said first electrode and said input terminal;

a second switch for opening and closing an interconnection between said second electrode and said common electrode;

a third switch for opening and closing an interconnection between said first electrode and said output terminal;

a fourth switch for opening and closing an interconnection between said first electrode and said fourth electrode;

a fifth switch for opening and closing an interconnection between said second electrode and said third electrode;

a sixth switch for opening and closing an interconnection between said fourth electrode and said common electrode;

a seventh switch for opening and closing an interconnection between said third electrode and said input terminal;

an eighth switch for opening and closing an interconnection between said third electrode and said output terminal; and signal generating means operatively coupled to said plurality of switches for generating a plurality of switch control signals for selectively opening and closing switches of said plurality of switches, wherein for a first combination of signal values of said plurality of switch control signals, said first and second capacitors are connected in series between said input terminal and said common electrode, said first capacitor is connected to said input terminal, said second capacitor is connected to said common electrode, and an interconnection between said first capacitor and said second capacitor is connected to said output terminal; and wherein for a second combination of signal values of said plurality of switch control signals, said first and second capacitors are connected in series between said input terminal and said common electrode, said second capacitor is connected to said input terminal, said first capacitor is connected to said common electrode, and an interconnection between said first capacitor and said second capacitor is connected to said output terminal; and said voltage step-down circuit further comprising control means for controlling said signal generating means based on a result of comparison between said stepped-down voltage and a reference voltage such that said signal generating means alternatively generates said plurality of switch control signals at least between said first combination of signal values and said second combination of signal values.

2. The voltage step-down circuit as in claim 1, wherein for a third combination of signal values, said plurality of switches are controlled such that said first capacitor is charged through said input terminal and said second capacitor discharges through said output terminal and said switches of said second combination are controlled such that said second capacitor is charged through said input terminal and said first capacitor discharges through said output terminal.

3. The voltage step-down circuit as in claim 1, wherein:

said load circuit comprises a dynamic random access memory including a sense amplifier and a memory cell array supplied with a precharged voltage for reading said random access memory in each operation cycle of a plurality of operation cycles in response to a precharge control pulse synchronized with a front edge of said operation cycle; and said output terminal is connected to said sense amplifier of said dynamic random access memory; and said voltage step-down circuit further comprising a ninth switch operable with said precharge control pulse for selectively opening and closing an interconnection between said input terminal and said output terminal.

4. The voltage step-down circuit as in claim 1, wherein:

said load circuit conducts a load current from said output terminal to said common electrode; and said control means comprises:
 a potentiometer for dividing a difference voltage between said power source voltage and said ground voltage to thereby provide a divided voltage; and
 a voltage comparator connected to said potentiometer for receiving said divided voltage as said reference voltage and connected to said output terminal for receiving said stepped-down voltage;

said voltage comparator outputting a level signal representative of the result of a comparison between said reference voltage and said stepped-down voltage.

5. The voltage step-down circuit as in claim 4, wherein:

said load circuit has a heavy load period and a light load period, wherein the current load during said heavy load period is larger than the current load during said light load period, wherein said stepped-down voltage varies between said heavy load period and said light load period; and said voltage step-down circuit further comprises:
 an auxiliary terminal having an auxiliary voltage lower than said reference voltage;
 an auxiliary comparator connected to said auxiliary terminal for receiving said auxiliary voltage and connected to said output terminal for receiving said stepped-down voltage, said auxiliary comparator outputting a result of a comparison between said stepped-down voltage and said auxiliary voltage; and
 a ninth switch, responsive to the result of said comparison between said stepped-down voltage and said auxiliary voltage, for selectively opening and closing an interconnection between said input terminal and said output terminal.

6. The voltage step-down circuit as in claim 5, wherein:

said level signal comprises a repeating pulse signal; and said voltage step-down circuit further comprises:
 a frequency counter for detecting a repetition frequency of said pulse signal and for outputting an auxiliary signal representative of a distinction between said heavy load period and said light load period; and
 auxiliary control means for controlling said auxiliary comparator in response to said auxiliary signal such that said result of comparison between said auxiliary voltage and said stepped-down voltage is output to said ninth switch.

7. The voltage step-down circuit as in claim 4, wherein said control means further comprises:

a first bistable circuit having a pair of inputs, wherein either input of said pair of inputs receives said level signal from said voltage comparator;

a second bistable circuit having a pair of inputs connected to respective input of a pair of outputs of said first bistable circuit and an output connected to said voltage dividing circuit for outputting a pulse signal and controlling said signal generating means;

a logic circuit connected to said output of said second bistable circuit for receiving said pulse signal, said logic circuit causing said pulse signal to be delayed in phase and changed in duration to thereby generate another pulse signal, and outputting said another pulse signal to the other input of said pair of inputs of said first bistable circuit.

8. The voltage step-down circuit as claimed in claim 4, wherein said control means further comprises:
   a flip-flop circuit having a pair of inputs, wherein either input of said pair of inputs receives said level signal from said voltage comparator and said flip-flop circuit outputs a first pulse signal;
   a delay circuit for delaying and inverting said first pulse signal to thereby output a second pulse signal;
   a NAND circuit for determining a NAND logic between said level signal and said second pulse signal to thereby output a third pulse signal;
   an inverter for inverting said third pulse signal to thereby output a fourth pulse signal to said voltage dividing circuit to thereby control said signal generating means; and
   a logic circuit for responding to said third pulse signal to output a reset pulse to the other input of the pair of inputs of said flip-flop circuit.

9. The voltage step-down circuit as in claim 1, wherein:
   said load circuit conducts a load current from said output terminal to said common electrode;
   said control means outputs a pulse signal representative of the result of a comparison between said reference voltage and said stepped-down voltage to thereby control said signal generating means; and
   said voltage step-down circuit further comprises:
      a second voltage dividing circuit including a second signal generating means; and
      second control means for controlling said second signal generating means,
   said second control means including a delay circuit for delaying said level signal output from said control means to thereby generate a second level signal for controlling said second signal generating means.

10. The voltage step-down circuit as in claim 9, further comprising:
    a third voltage dividing circuit including third signal generating means; and
    third control means for controlling said third signal generating means,
    said third control means including of a delay circuit for delaying said second level signal output from said second control means to thereby generate a third level signal for controlling said third signal generating means.

11. A voltage step-down circuit included in a semiconductor integrated circuit chip including a first terminal coupled to an external power source voltage, a second terminal connected to a reference voltage, and an internal circuit connected to said first and second terminals, said voltage step-down circuit stepping-down said external power source voltage and applying said stepped-down voltage to said internal circuit, said voltage step-down circuit comprising:
    a voltage divider circuit including:
       first and second capacitors having an equal capacity;
       two pairs of first switch elements connected between a first electrode of said first capacitor and a first electrode of said second capacitor and said first terminal and connected between a second electrode of said first capacitor and a second electrode of said second capacitor and said second terminal and which are selectively charged in response to a control signal;
       a pair of second switch elements connected between said first electrode of said first capacitor and said second electrode of said second capacitor and connected between said second electrode of said first capacitor and said first electrode of said second capacitor and which are selectively charged in response to said control signal;
       a pair of third switch elements connected in series between said first electrode of said first capacitor and said first electrode of said second capacitor and which are selectively charged in response to said control signal;
       an output terminal connected to a connection point between said pair of third switch elements and said internal circuit; and
       control signal generating means for generating said control signals for controlling conduction states of said first, second and third switch elements such that said first and second capacitors are alternately charged by said external power source voltage supplied from said first terminal and are alternately discharged to said internal circuit from said output terminal in a complementary manner to the charging; and
    connection control signal generating means for generating a connection control signal for controlling the generation of said control signals in said control signal generating means in response to a comparison result between a discharge output to said internal circuit and a predetermined comparison reference voltage;
    wherein said connection control signal generating means includes:
       voltage comparator means having first and second input terminals;
       voltage dividing means connected to said first terminal for dividing said external power source voltage to generate said comparison reference voltage; and
       wiring means for connecting said first input terminal of said voltage comparator means to said output terminal and said second input terminal of said voltage comparator means to said voltage dividing means;
    wherein said internal circuit includes:
       a circuit of a dynamic random access memory which has a first operational period operable by a first current and a second operational period operable by a second current, wherein said first current has a heavier load than said second current and said first and second currents are for varying said discharge output on said output terminal;
       supplementary voltage comparator means for comparing said discharge output with a supplementary comparison reference voltage lower than said comparison reference voltage; and
       a switch element which is connected between said first terminal and said output terminal and is selectively charged in response to an output of said supplementary voltage comparator means.

12. The circuit as in claim 11, further including:
    a frequency counter connected to said output of said supplementary voltage comparator means for detecting said first operational period and said second operational period and for detecting a repeat frequency of a pulse output appearing on said output of said supplementary voltage comparator means; and means for controlling said supplementary voltage comparator means to be selectively made operational in response to said output of said frequency counter and to cause said output of said supplementary voltage comparator means to be supplied to said switch element.

13. A voltage step-down circuit included in a semiconductor integrated circuit chip including a first terminal coupled to an external power source voltage, a second terminal connected to a reference voltage, and an internal circuit connected to said first and second terminals, said voltage step-down circuit stepping-down said external power source voltage and applying said stepped-down voltage to said internal circuit, said voltage step-down circuit comprising:

a voltage divider circuit including:
first and second capacitors having an equal capacity;
two pairs of first switch elements connected between a first electrode of said first capacitor and a first electrode of said second capacitor and said first terminal and connected between a second electrode of said first capacitor and a second electrode of said second capacitor and said second terminal and which are selectively charged in response to a control signal;
a pair of second switch elements connected between said first electrode of said first capacitor and said second electrode of said second capacitor and connected between said second electrode of said first capacitor and said first electrode of said second capacitor and which are selectively charged in response to said control signal;
a pair of third switch elements connected in series between said first electrode of said first capacitor and said first electrode of said second capacitor and which are selectively charged in response to said control signal;
an output terminal connected to a connection point between said pair of third switch elements and said internal circuit; and
control signal generating means for generating said control signals for controlling conduction states of said first, second and third switch elements such that said first and second capacitors are alternately charged by said external power source voltage supplied from said first terminal and are alternately discharged to said internal circuit from said output terminal in a complementary manner to the charging; and connection control signal generating means for generating a connection control signal for controlling said generation of said control signals in said control signal generating means in response to a comparison result between a discharge output to said internal circuit and a predetermined comparison reference voltage;

wherein said connection control signal generating means includes:
voltage comparator means having first and second input terminals;
voltage dividing means connected to said first terminal for dividing said external power source voltage to generate said comparison reference voltage; and
wiring means for connecting said first input terminal of said voltage comparator means to said output terminal and said second input terminal of said voltage comparator means to said voltage dividing means;

wherein said control signal generating means includes:

a first bistable circuit for receiving said output of said voltage comparator means at one input terminal of a pair of input terminals;
a second bistable circuit for receiving a pair of outputs of said first bistable circuit at a pair of input terminals and for supplying an output thereof as said connection control signal to said voltage dividing means; and
a logic circuit which outputs a delay to said connection control signal and executes a pulse width conversion to supply a pulse width converted signal to another input terminal of said pair of input terminals of said first bistable circuit.

14. A voltage step-down circuit included in a semiconductor integrated circuit chip including a first terminal coupled to an external power source voltage, a second terminal connected to a reference voltage, and an internal circuit connected to said first and second terminals, said voltage step-down circuit stepping-down said external power source voltage and applying said stepped-down voltage to said internal circuit, said voltage step-down circuit comprising:

a voltage divider circuit including:
first and second capacitors having an equal capacity;
two pairs of first switch elements connected between a first electrode of said first capacitor and a first electrode of said second capacitor and said first terminal and connected between a second electrode of said first capacitor and a second electrode of said second capacitor and said second terminal and which are selectively charged in response to a control signal;
a pair of second switch elements connected between said first electrode of said first capacitor and said second electrode of said second capacitor and connected between said second electrode of said first capacitor and said first electrode of said second capacitor and which are selectively charged in response to said control signal;
a pair of third switch elements connected in series between said first electrode of said first capacitor and said first electrode of said second capacitor and which are selectively charged in response to said control signal;
an output terminal connected to a connection point between said pair of third switch elements and said internal circuit; and
control signal generating means for generating said control signals for controlling conduction states of said first, second and third switch elements such that said first and second capacitors are alternately charged by said external power source voltage supplied from said first terminal and are alternately discharged to said internal circuit from said output terminal in a complementary manner to the charging; and connection control signal generating means for generating a connection control signal for controlling said generation of said control signals in said control signal generating means in response to a comparison result between a discharge output to said internal circuit and a predetermined comparison reference voltage;

wherein said connection control signal generating means includes:
voltage comparator means having first and second input terminals;
voltage dividing means connected to said first terminal for dividing said external power source voltage to generate said comparison reference voltage; and wiring means for connecting said first input terminal of said voltage comparator means to said output terminal and said second input terminal of said voltage comparator means to said voltage dividing means;

said voltage step-down circuit further comprising:

at least one delay circuit connected to an output of said voltage comparator means and for outputting a delay connection control signal; and at least one subordinate voltage divider circuit, including first and second terminals connected to corresponding ones of said first and second output terminals of said voltage divider circuit, and which inputs said delay connection control signal by control signal generating means corresponding to said control signal generating means of said voltage divider circuit.

15. The circuit as in claim 14, wherein three delay circuits are connected to an output of said voltage comparator means and three subordinate voltage divider circuits are connected to corresponding ones of said first and second output terminals of said voltage divider circuit.

* * * * *